US012635194B2

(12) United States Patent (10) Patent No.: US 12,635,194 B2
Jang et al. (45) Date of Patent: May 19, 2026

(54) SEMICONDUCTOR DEVICE

(71) Applicant: SAMSUNG ELECTRONICS CO., LTD., Suwon-si (KR)

(72) Inventors: Jin Kyu Jang, Suwon-si (KR); Byoung Hoon Lee, Suwon-si (KR); Chan Hyeong Lee, Suwon-si (KR); Nam Gyu Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 632 days.

(21) Appl. No.: 18/085,886

(22) Filed: Dec. 21, 2022

(65) Prior Publication Data

US 2023/0378263 A1 Nov. 23, 2023

(30) Foreign Application Priority Data

May 17, 2022 (KR) ........................ 10-2022-0060251

(51) Int. Cl.
| *H10D 62/10* | (2025.01) |
| *H10D 30/43* | (2025.01) |
| *H10D 30/67* | (2025.01) |
| *H10D 64/01* | (2025.01) |
| *H10D 64/27* | (2025.01) |

(52) U.S. Cl.
CPC .......... *H10D 62/121* (2025.01); *H10D 30/43* (2025.01); *H10D 30/6757* (2025.01); *H10D 64/021* (2025.01); *H10D 64/513* (2025.01)

(58) Field of Classification Search
CPC . H10D 84/0177; H10D 64/517; H10D 64/667
See application file for complete search history.

(56) References Cited

U.S. PATENT DOCUMENTS

| 9,425,103 | B2 | 8/2016 | Xie et al. | |
| 9,871,116 | B2 | 1/2018 | Basker et al. | |
| 10,930,651 | B2 | 2/2021 | Kim et al. | |
| 11,139,295 | B2 | 10/2021 | Chang et al. | |
| 11,158,635 | B2 | 10/2021 | Shao et al. | |
| 11,244,871 | B2 | 2/2022 | Chiang et al. | |
| 2012/0313178 | A1* | 12/2012 | Liao .................... | H10D 64/017 |
| | | | | 257/368 |
| 2013/0280900 | A1* | 10/2013 | Lai ..................... | H10D 84/0177 |
| | | | | 438/589 |
| 2018/0012806 | A1 | 1/2018 | Li et al. | |
| 2018/0033866 | A1* | 2/2018 | Liao .................. | H01L 21/76897 |

(Continued)

*Primary Examiner* — Tuan A Hoang

(74) *Attorney, Agent, or Firm* — Muir Patent Law, PLLC

(57) ABSTRACT

A semiconductor device includes an active pattern; gate spacers on the active pattern defining a gate trench; a gate insulating layer along a sidewall and a bottom surface of the gate trench; a first conductive layer on the gate insulating layer; a second conductive layer on the first conductive layer in the gate trench; a third conductive layer on the second conductive layer in the gate trench and including a first portion between parts of the second conductive layer, and a second portion on the first portion and in contact with an upper surface of the second conductive layer; and a capping pattern on the second and third conductive layers and including a portion between the gate insulating layer and the second portion, and in contact with a sidewall of the second portion, wherein a width of the second portion is greater than a width of the first portion.

20 Claims, 30 Drawing Sheets

(56)          References Cited

U.S. PATENT DOCUMENTS

2019/0355825 A1 * 11/2019 Yim ........................ H10D 84/85
2020/0066719 A1    2/2020 Chang et al.
2021/0358910 A1   11/2021 Lee et al.
2022/0020861 A1    1/2022 Lee et al.
2022/0051895 A1 *  2/2022 Raisanen ........... H10D 30/6739
2022/0140097 A1 *  5/2022 Hsu ................... H10D 84/0177

* cited by examiner

SEMICONDUCTOR DEVICE

CROSS-REFERENCE TO RELATED APPLICATION

This application claims priority from Korean Patent Application No. 10-2022-0060251 filed on May 17, 2022 in the Korean Intellectual Property Office, and all the benefits accruing therefrom under 35 U.S.C. 119, the contents of which in its entirety are herein incorporated by reference.

BACKGROUND

1. Technical Field

Embodiments relate to a semiconductor device.

2. Description of the Related Art

As one of the scaling techniques to increase density of an integrated circuit device, a multi-gate transistor in which a fin-shaped or a nanowire-shaped silicon body is formed on a substrate, and a gate is formed on a surface of the silicon body has been considered.

A multi-gate transistor may use a three-dimensional channel, and it is easy to perform scaling. In addition, the multi-gate transistor may help improve current control capability even without increasing a gate length of the multi-gate transistor. In addition, the multi-gate transistor may help effectively suppress a short channel effect (SCE) in which a potential of a channel region is affected by a drain voltage.

SUMMARY

The embodiments may be realized by providing a semiconductor device including a substrate in which a first region and a second region are defined; a first active pattern extending in a first horizontal direction on the first region of the substrate; first gate spacers extending in a second horizontal direction different from the first horizontal direction on the first active pattern and defining a first gate trench; a first gate insulating layer along a sidewall and a bottom surface of the first gate trench; a first conductive layer on the first gate insulating layer in the first gate trench; a second conductive layer on the first conductive layer in the first gate trench; a third conductive layer on the second conductive layer in the first gate trench, the third conductive layer including a first portion between parts of the second conductive layer, and a second portion on the first portion and in contact with an upper surface of the second conductive layer; and a first capping pattern on the second conductive layer and the third conductive layer, the first capping pattern including a portion that is between the first gate insulating layer and the second portion of the third conductive layer, and in contact with a sidewall of the second portion of the third conductive layer, wherein a width of the second portion of the third conductive layer in the first horizontal direction is greater than a width of the first portion of the third conductive layer in the first horizontal direction.

The embodiments may be realized by providing a semiconductor device including a substrate in which a PMOS region and an NMOS region are defined; a first active pattern extending in a first horizontal direction on the PMOS region of the substrate; a second active pattern extending in the first horizontal direction on the NMOS region of the substrate; first gate spacers extending in a second horizontal direction different from the first horizontal direction on the first active pattern and defining a first gate trench; second gate spacers extending in the second horizontal direction on the second active pattern and defining a second gate trench; a first conductive layer along a sidewall and a bottom surface of the first gate trench; a second conductive layer on the first conductive layer in the first gate trench; a third conductive layer on the second conductive layer in the first gate trench, the third conductive layer including a first portion between parts of the second conductive layer, and a second portion on the first portion and in contact with an upper surface of the second conductive layer; a fourth conductive layer along a sidewall and a bottom surface of the second gate trench, the fourth conductive layer including the same material as the second conductive layer; a fifth conductive layer on the fourth conductive layer in the second gate trench, the fifth conductive layer including the same material as the third conductive layer, and including a first portion between parts of the fourth conductive layer, and a second portion on the first portion; a first capping pattern on the second conductive layer and the third conductive layer, the first capping pattern including a portion that is between the first gate spacers and the second portion of the third conductive layer, and in contact with a sidewall of the second portion of the third conductive layer; and a second capping pattern on the fourth conductive layer and the fifth conductive layer, the second capping pattern including a portion that is between the second gate spacers and the second portion of the fifth conductive layer, and in contact with a sidewall of the second portion of the fifth conductive layer, wherein the first conductive layer includes a material different from that of the second conductive layer, and a width of the second portion of the third conductive layer in the first horizontal direction is greater than a width of the first portion of the third conductive layer in the first horizontal direction.

The embodiments may be realized by providing a semiconductor device including a substrate in which a PMOS region and an NMOS region are defined; a first active pattern extending in a first horizontal direction on the PMOS region of the substrate; a second active pattern extending in the first horizontal direction on the NMOS region of the substrate; a first plurality of nanosheets stacked to be spaced apart from each other in a vertical direction on the first active pattern; a second plurality of nanosheets stacked to be spaced apart from each other in the vertical direction on the second active pattern; first gate spacers extending in a second horizontal direction different from the first horizontal direction on the first active pattern and defining a first gate trench; second gate spacers extending in the second horizontal direction on the second active pattern and defining a second gate trench; a first gate insulating layer along a sidewall and a bottom surface of the first gate trench; a first conductive layer on the first gate insulating layer in the first gate trench, the first conductive layer including titanium aluminum nitride (TiAlN); a second conductive layer on the first conductive layer in the first gate trench, the second conductive layer including titanium aluminum carbide (TiAlC); a third conductive layer on the second conductive layer in the first gate trench, the third conductive layer including titanium nitride (TiN), and including a first portion between parts of the second conductive layer, and a second portion on the first portion and in contact with an upper surface of the second conductive layer; a second gate insulating layer along a sidewall and a bottom surface of the second gate trench; a fourth conductive layer on the second gate insulating layer in the second gate trench, the fourth conductive layer including titanium aluminum carbide (TiAlC); a fifth conductive layer on the fourth conductive layer in the second gate trench, the fifth conductive layer including titanium nitride (TiN) and including a first portion between parts of the fourth conductive layer, and a second portion on the first portion; and a first capping pattern on the second conductive layer and the third conductive layer, the first capping pattern including a portion that is between the first gate spacers and the second portion of the third conductive layer, and in contact with a sidewall of the second portion of the third conductive layer, a second capping pattern on the fourth conductive layer and the fifth conductive layer, the second capping pattern including a portion that is between the second gate spacers and the second portion of the fifth conductive layer, and in contact with a sidewall of the second portion of the fifth conductive layer; a first gate contact penetrating through the first capping pattern in the vertical direction and connected to the third conductive layer; and a second gate contact penetrating through the second capping pattern in the vertical direction and connected to the fifth conductive layer, wherein a width of the second portion of the third conductive layer in the first horizontal direction is greater than a width of the first portion of the third conductive layer in the first horizontal direction.

BRIEF DESCRIPTION OF THE DRAWINGS

Features will be apparent to those of skill in the art by describing in detail exemplary embodiments with reference to the attached drawings in which:

FIGS. 4 to 25 are views of stages in a method of manufacturing a semiconductor device according to exemplary embodiments of the present disclosure;

DETAILED DESCRIPTION

Figure 1:
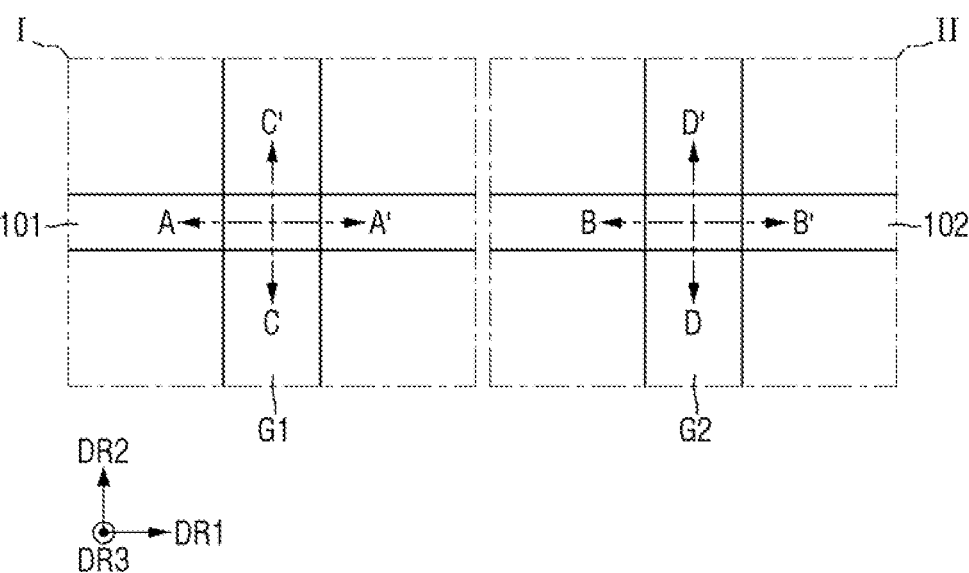
FIG. 1 is a schematic layout view of a semiconductor device according to exemplary embodiments of the present disclosure.

In the drawings related to a semiconductor device according to some exemplary embodiments, it is exemplarily described that the semiconductor device includes a multi-bridge channel field effect transistor (MBCFET™) including a nanosheet and a fin-type transistor (FinFET) including a channel region having a fin-shaped pattern shape, but the present disclosure is not limited thereto.

Hereinafter, a semiconductor device according to some exemplary embodiments of the present disclosure will be described with reference to FIGS. 1 to 3.

FIG. 1 is a schematic layout view of a semiconductor device according to exemplary embodiments of the present disclosure. FIG. 2 is a cross-sectional view taken along lines A-A' and B-B' of FIG. 1, respectively. FIG. 3 is a cross-sectional view taken along lines C-C' and D-D' of FIG. 1, respectively.

Figure 2:
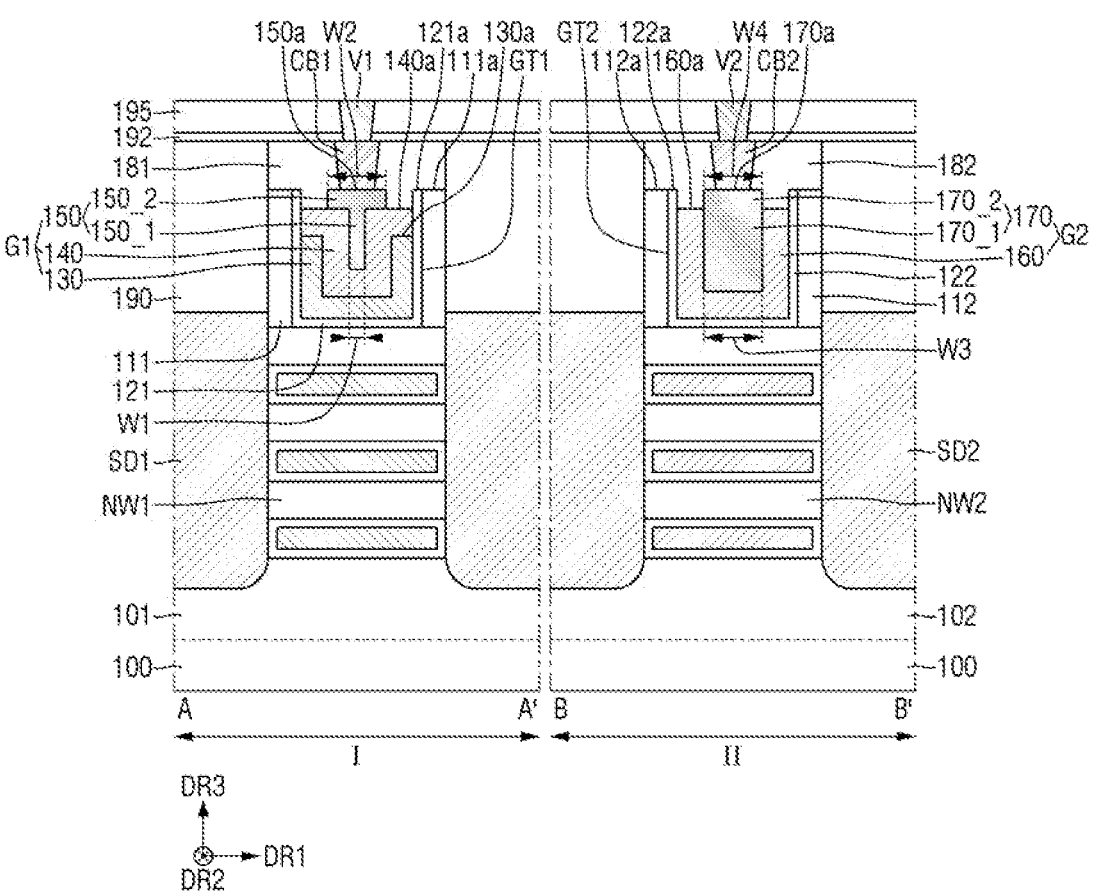
FIG. 2 is a cross-sectional view taken along lines A-A' and B-B' of FIG. 1, respectively.
Figure 3:
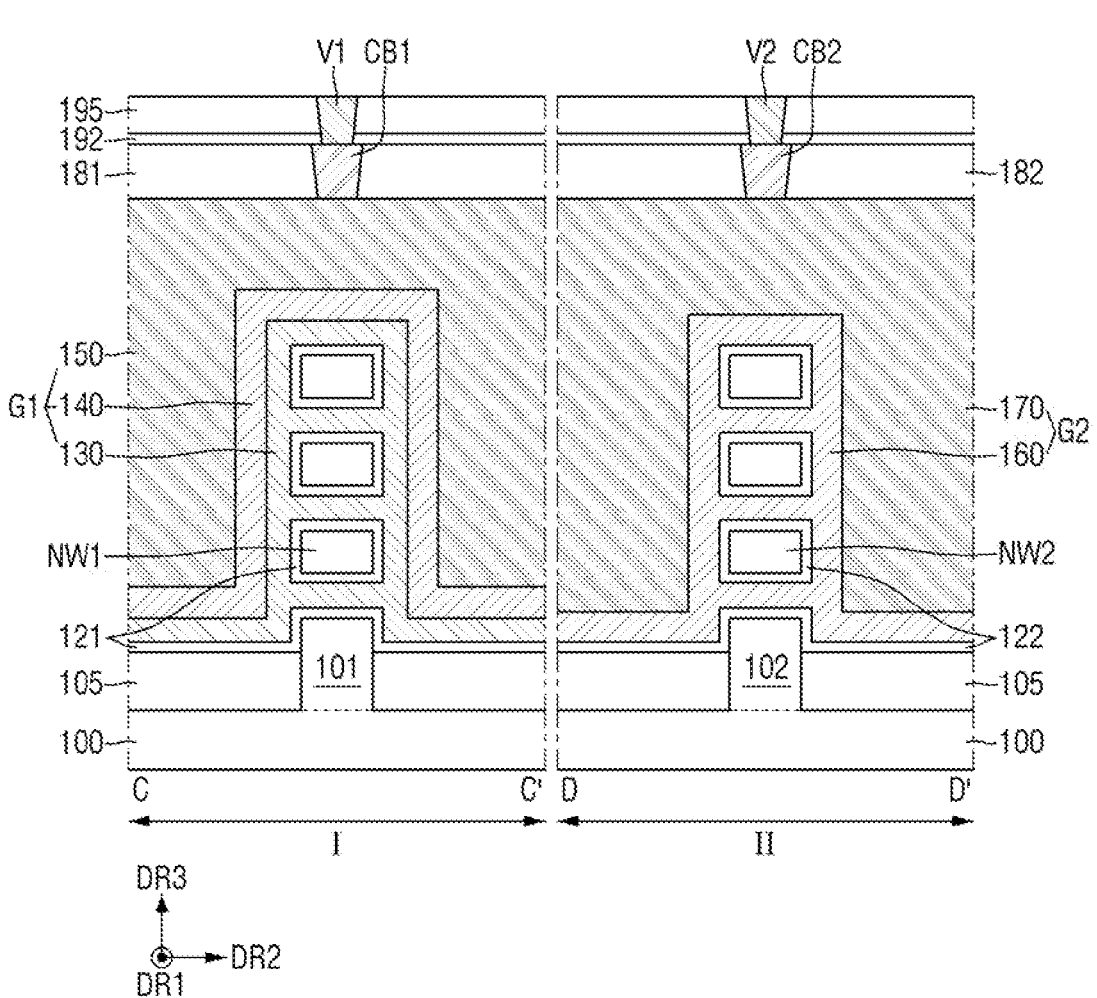
FIG. 3 is a cross-sectional view taken along lines C-C' and D-D' of FIG. 1, respectively.

Referring to FIGS. 1 to 3, a semiconductor device according to exemplary embodiments of the present disclosure may include a substrate 100, first and second active patterns 101 and 102, a field insulating layer 105, a plurality of first and second nanosheets NW1 and NW2, first and second gate electrodes G1 and G2, first and second gate spacers 111 and 112, first and second gate insulating layers 121 and 122, first and second capping patterns 181 and 182, first and second source/drain regions SD1 and SD2, a first interlayer insulating layer 190, first and second gate contacts CB1 and CB2, an etching stop layer 192, a second interlayer insulating layer 195, and first and second vias V1 and V2. As used herein, the terms "first," "second," and the like are merely for identification and differentiation, and are not intended to imply or require sequential inclusion (e.g., a third element and a fourth element may be described without implying or requiring the presence of a first element or second element).

The substrate 100 may be a silicon substrate or a silicon-on-insulator (SOI). In an implementation, the substrate 100 may include, e.g., silicon germanium, silicon germanium on insulator (SGOI), indium antimonide, a lead tellurium compound, indium arsenide, indium phosphide, gallium arsenide, or gallium antimonide. As used herein, the term "or" is not an exclusive term, e.g., "A or B" would include A, B, or A and B.

The substrate 100 may include a first region I and a second region II. In an implementation, the first region I of the substrate 100 may be defined as a PMOS region. In an implementation, a PMOS transistor may be formed on the first region I of the substrate 100. In an implementation, the second region II of the substrate 100 may be defined as an NMOS region. In an implementation, an NMOS transistor may be formed on the second region II of the substrate 100.

The first active pattern 101 may extend (e.g., lengthwise) in a first horizontal direction DR1 on the first region I of the substrate 100. The second active pattern 102 may extend in the first horizontal direction DR1 on the second region II of the substrate 100. Each of the first and second active patterns 101 and 102 may protrude from the substrate 100 in a vertical direction DR3. Hereinafter, a second horizontal direction DR2 may be defined as a direction different from the first horizontal direction DR1, and the vertical direction DR3 may be defined as a direction perpendicular to each of the first and second horizontal directions DR1 and DR2.

Each of the first and second active patterns 101 and 102 may be a portion of the substrate 100, and may include an epitaxial layer grown from the substrate 100. Each of the first and second active patterns 101 and 102 may include, e.g., silicon or germanium, which is an elemental semiconductor material. In an implementation, each of the first and second active patterns 101 and 102 may include a compound semiconductor, e.g., a group IV-IV compound semiconductor or a group III-V compound semiconductor.

The field insulating layer 105 may be on the substrate 100. The field insulating layer 105 may surround a sidewall of each of the first and second active patterns 101 and 102. In an implementation, each of the first and second active patterns 101 and 102 may protrude from or above an upper surface of the field insulating layer 105 in the vertical direction DR3. The field insulating layer 105 may include, e.g., an oxide film, a nitride film, an oxynitride film, or a combination thereof.

The first plurality of nanosheets NW1 may be on the first active pattern 101. The first plurality of nanosheets NW1 may include a plurality of nanosheets stacked to be spaced apart from each other in the vertical direction DR3. The first plurality of nanosheets NW1 may be at or on a portion where the first active pattern 101 and the first gate electrode G1 intersect. The second plurality of nanosheets NW2 may be on the second active pattern 102. The second plurality of nanosheets NW2 may include a plurality of nanosheets stacked to be spaced apart from each other in the vertical direction DR3. The second plurality of nanosheets NW2 may be at or on a portion where the second active pattern 102 and the second gate electrode G2 intersect. Each of the plurality of first upper nanosheets NW1 and the plurality of second upper nanosheets NW2 may include, e.g., silicon (Si).

In an implementation, as illustrated in FIGS. 2 and 3, each of the plurality of first and second nanosheets NW1 and NW2 may include three nanosheets stacked to be spaced apart from each other in the vertical direction DR3. In an implementation, each of the plurality of first and second nanosheets NW1 and NW2 may include four or more nanosheets stacked to be spaced apart from each other in the vertical direction DR3.

The first gate spacer 111 may be on the first region I of the substrate 100. The first gate spacer 111 may extend in the second horizontal direction DR2 on the uppermost nanosheet of the first plurality of nanosheets NW1 and the field insulating layer 105. The first gate spacer 111 may include two spacers spaced apart from each other in the first horizontal direction DR1. A first gate trench GT1 may be defined between the two spacers of the first gate spacer 111.

The second gate spacer 112 may be on the second region II of the substrate 100. The second gate spacer 112 may extend in the second horizontal direction DR2 on the uppermost nanosheet of the second plurality of nanosheets NW2 and the field insulating layer 105. The second gate spacer 112 may include two spacers spaced apart from each other in the first horizontal direction DR1. A second gate trench GT2 may be defined between the two spacers of the second gate spacer 112.

Each of the first and second gate spacers 111 and 112 may include, e.g., silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), or a combination thereof.

The first gate electrode G1 may be on the first region I of the substrate 100. The first gate electrode G1 may extend in the second horizontal direction DR2 on the first active pattern 101 and the field insulating layer 105. The first gate electrode G1 may be inside the first gate trench GT1. In an implementation, the first gate electrode G1 may surround the first plurality of nanosheets NW1. The second gate electrode G2 may be on the second region II of the substrate 100. The second gate electrode G2 may extend in the second horizontal direction DR2 on the second active pattern 102 and the field insulating layer 105. The second gate electrode G2 may be inside the second gate trench GT2. In an implementation, the second gate electrode G2 may surround the second plurality of nanosheets NW2. Each of the first and second gate electrodes G1 and G2 will be described in greater detail below.

The first source/drain region SD1 may be on at least one side of the first plurality of nanosheets NW1 on the first active pattern 101. In an implementation, the first source/drain region SD1 may be on both sides of the first plurality of nanosheets NW1 on the first active pattern 101. The first source/drain region SD1 may be in contact (e.g., direct contact) with the first plurality of nanosheets NW1. The second source/drain region SD2 may be on at least one side of the second plurality of nanosheets NW2 on the second active pattern 102. In an implementation, the second source/drain region SD2 may be on both sides of the second plurality of nanosheets NW2 on the second active pattern 102. The second source/drain region SD2 may be in contact with the second plurality of nanosheets NW2.

In an implementation, as illustrated in FIG. 2, an upper surface of the first source/drain region SD1 may be higher (e.g., farther from the substrate 100 in the vertical direction DR3) than an upper surface of the uppermost nanosheet of the first plurality of nanosheets NW1, and an upper surface of the second source/drain region SD2 may be higher than an upper surface of the uppermost nanosheet of the second plurality of nanosheets NW2.

The first gate insulating layer 121 may be on or along a sidewall and a bottom surface of the first gate trench GT1. In an implementation, the first gate insulating layer 121 may be between the first gate spacer 111 and the first gate electrode G1 in the first gate trench GT1. The first gate insulating layer 121 may be between the first gate electrode G1 and the first plurality of nanosheets NW1. The first gate insulating layer 121 may be between the first gate electrode G1 and the first active pattern 101. The first gate insulating layer 121 may be between the first gate electrode G1 and the first source/drain region SD1.

The second gate insulating layer 122 may be on or along a sidewall and a bottom surface of the second gate trench GT2. In an implementation, the second gate insulating layer 122 may be between the second gate spacer 112 and the second gate electrode G2 in the second gate trench GT2. The second gate insulating layer 122 may be between the second gate electrode G2 and the second plurality of nanosheets NW2. The second gate insulating layer 122 may be between the second gate electrode G2 and the second active pattern 102. The second gate insulating layer 122 may be between the second gate electrode G2 and the second source/drain region SD2.

Each of the first and second gate insulating layers 121 and 122 may include, e.g., silicon oxide, silicon oxynitride, silicon nitride, or a high-k material having a dielectric constant greater than that of silicon oxide. The high-k material may include, e.g., hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

In an implementation, the semiconductor device may include a negative capacitance (NC) field effect transistor (FET) using a negative capacitor. In an implementation, each of the first and second gate insulating layers 121 and 122 may include a ferroelectric material film having ferroelectric characteristics and a paraelectric material film having paraelectric characteristics.

The ferroelectric material film may have a negative capacitance, and the paraelectric material film may have a positive capacitance. In an implementation, when two or more capacitors are connected to each other in series and the capacitance of each capacitor has a positive value, a total capacitance decreases as compared with a capacitance of each individual capacitor. In an implementation, when at least one of the capacitances of two or more capacitors connected to each other in series has a negative value, the total capacitance may be greater than an absolute value of each individual capacitance while having a positive value.

When the ferroelectric material film having the negative capacitance and the paraelectric material film having the positive capacitance are connected to each other in series, a total capacitance value of the ferroelectric material film and the paraelectric material film connected to each other in series may increase. A transistor including the ferroelectric material film may have a subthreshold swing (SS) less than 60 mV/decade at room (e.g., ambient) temperature, using the increase in the total capacitance value.

The ferroelectric material film may have the ferroelectric characteristics. The ferroelectric material film may include, e.g., hafnium oxide, hafnium zirconium oxide, barium strontium titanium oxide, barium titanium oxide, or lead zirconium titanium oxide. In an implementation, the hafnium zirconium oxide may be a material obtained by doping hafnium oxide with zirconium (Zr). In an implementation, the hafnium zirconium oxide may also be a compound of hafnium (Hf), zirconium (Zr), and oxygen (O).

The ferroelectric material film may further include a doped dopant. In an implementation, the dopant may include, e.g., aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A type of dopant included in the ferroelectric material film may vary depending on a type of ferroelectric material included in the ferroelectric material film.

When the ferroelectric material film includes hafnium oxide, the dopant included in the ferroelectric material layer may include, e.g., gadolinium (Gd), silicon (Si), zirconium (Zr), aluminum (Al), or yttrium (Y).

When the dopant is aluminum (Al), the ferroelectric material film may include 3 to 8 atomic % (at %) of aluminum. Here, an at % of the dopant may be a % of number of aluminum atoms to a total sum of atoms of hafnium and aluminum.

When the dopant is silicon (Si), the ferroelectric material film may include 2 to 10 at % of silicon. When the dopant is yttrium (Y), the ferroelectric material film may include 2 to 10 at % of yttrium. When the dopant is gadolinium (Gd), the ferroelectric material film may contain 1 to 7 at % of gadolinium. When the dopant is zirconium (Zr), the ferroelectric material film may include 50 to 80 at % of zirconium.

The paraelectric material film may have the paraelectric characteristics. The paraelectric material film may include, e.g., silicon oxide or a metal oxide having a high dielectric constant. In an implementation, the metal oxide included in the paraelectric material film may include, e.g., hafnium oxide, zirconium oxide, or aluminum oxide.

The ferroelectric material film and the paraelectric material film may include the same material. The ferroelectric material film may have the ferroelectric characteristics, and the paraelectric material film may not have the ferroelectric characteristics. In an implementation, when the ferroelectric material film and the paraelectric material film include the hafnium oxide, a crystal structure of the hafnium oxide included in the ferroelectric material film may be different from a crystal structure of the hafnium oxide included in the paraelectric material film.

The ferroelectric material film may have a thickness having the ferroelectric characteristics. In an implementation, the thickness of the ferroelectric material film may be, e.g., 0.5 to 10 nm. Acritical thickness representing the ferroelectric characteristics may vary for each ferroelectric material, and the thickness of the ferroelectric material film may vary depending on the ferroelectric material.

In an implementation, each of the first and second gate insulating layers 121 and 122 may include one ferroelectric material film. In an implementation, each of the first and second gate insulating layers 121 and 122 may include a plurality of ferroelectric material films spaced apart from each other. Each of the first and second gate insulating layers 121 and 122 may have a stacked film structure in which a plurality of ferroelectric material films and a plurality of paraelectric material films are alternately stacked.

The first gate electrode G1 may include a first conductive layer 130, a second conductive layer 140, and a third conductive layer 150. The first conductive layer 130 may be on the first gate insulating layer 121 in the first gate trench GT1. The first conductive layer 130 may be along the sidewall and the bottom surface of the first gate trench GT1. The first conductive layer 130 may surround the first plurality of nanosheets NW1. In an implementation, the first conductive layer 130 may completely fill spaces between the first plurality of nanosheets NW1 on the first gate insulating layer 121. In an implementation, the first conductive layer 130 may completely fill spaces between the first active pattern 101 and the first plurality of nanosheets NW1 on the first gate insulating layer 121. In an implementation, the first conductive layer 130 may be conformally formed. The first conductive layer 130 may be in contact with the first gate insulating layer 121.

In an implementation, an uppermost surface 130a of the first conductive layer 130 may be lower (e.g., closer to the substrate in the vertical direction DR3) than an uppermost surface 121a of the first gate insulating layer 121 and lower than an uppermost surface 111a of the first gate spacer 111. In an implementation, the first conductive layer 130 may include a metal or metal nitride. In an implementation, the first conductive layer 130 may include titanium aluminum nitride (TiAlN). In an implementation, the first conductive layer 130 may also include titanium nitride (TiN).

The second conductive layer 140 may be on the first conductive layer 130 in the first gate trench GT1. At least a portion of the second conductive layer 140 may be on the uppermost surface 130a of the first conductive layer 130. The second conductive layer 140 may be on the uppermost surface 130a of the first conductive layer 130 and may be in contact with the first gate insulating layer 121. In an implementation, the second conductive layer 140 may be conformally formed. The second conductive layer 140 may be in contact with the first conductive layer 130.

In an implementation, an uppermost surface 140a of the second conductive layer 140 may be lower than the uppermost surface 121a of the first gate insulating layer 121 and lower than the uppermost surface 111a of the first gate spacer 111. In an implementation, the uppermost surface 140a of the second conductive layer 140 may be higher than the uppermost surface 130a of the first conductive layer 130. The second conductive layer 140 may include a material different from that of the first conductive layer 130. In an implementation, the second conductive layer 140 may include a metal (e.g., a non-compounded metal) or a metal carbide. In an implementation, the second conductive layer 140 may include titanium aluminum carbide (TiAlC). In an implementation, an amount of aluminum included in the second conductive layer 140 may be 20 at % to 40 at %, e.g., based on a total number of atoms in the second conductive layer 140. In an implementation, a thickness of the second conductive layer 140 may be greater than a thickness of the first conductive layer 130.

The third conductive layer 150 may be on the second conductive layer 140 in the first gate trench GT1. At least a portion of the third conductive layer 150 may be between portions of the second conductive layer 140. The third conductive layer 150 may be in contact with the second conductive layer 140. The third conductive layer 150 may include a first portion 150_1 between the portions of the second conductive layer 140 and a second portion 150_2 on the first portion 150_1.

The first portion 150_1 of the third conductive layer 150 may completely fill a space between the portions of second conductive layer 140 in the first gate trench GT1. The second portion 150_2 of the third conductive layer 150 may be in contact with the first portion 150_1 of the third conductive layer 150. The second portion 150_2 of the third conductive layer 150 may be in contact with the uppermost surface 140a of the second conductive layer 140. In an implementation, a width W2 of the second portion 150_2 of the third conductive layer 150 in the first horizontal direction DR1 may be greater than a width W1 of the first portion 150_1 of the third conductive layer 150 in the first horizontal direction DR1. The second portion 150_2 of the third conductive layer 150 may be spaced apart from the first gate insulating layer 121 in the first horizontal direction DR1 in the first gate trench GT1.

In an implementation, the width W2 of the second portion 150_2 of the third conductive layer 150 in the first horizontal direction DR1 may be smaller than a total width of the second conductive layer 140 between portions of the first conductive layer 130 in the first horizontal direction DR1. In an implementation, the width W2 of the second portion 150_2 of the third conductive layer 150 in the first horizontal direction DR1 may be the same as the total width of the second conductive layer 140 between the portions of the first conductive layer 130 in the first horizontal direction DR1. In an implementation, the width W2 of the second portion 150_2 of the third conductive layer 150 in the first horizontal direction DR1 may be smaller than the width of the second conductive layer 140 between the portions of the first conductive layer 130 in the first horizontal direction DR1.

An upper surface 150a of the third conductive layer 150 may be higher than the uppermost surface 140a of the second conductive layer 140. In an implementation, the upper surface 150a of the second portion 150_2 of the third conductive layer 150 may be higher than the uppermost surface 140a of the second conductive layer 140. In an implementation, the upper surface 150a of the second portion 150_2 of the third conductive layer 150 may be on the same plane as the uppermost surface 121a of the first gate insulating layer 121 and on the same plane as the uppermost surface 111a of the first gate spacer 111. In an implementation, the upper surface 150a of the second portion 150_2 of the third conductive layer 150 may be lower than the uppermost surface 121a of the first gate insulating layer 121 and lower than the uppermost surface 111a of the first gate spacer 111.

In an implementation, the third conductive layer 150 may include a material different from that of each of the first conductive layer 130 and the second conductive layer 140. In an implementation, the third conductive layer 150 may include the same material as that of the first conductive layer 130 and a material different from that of the second conductive layer 140. The third conductive layer 150 may include a metal or a metal nitride. In an implementation, the third conductive layer 150 may include titanium nitride (TiN).

The first capping pattern 181 may extend in the second horizontal direction DR2 on the first gate electrode G1. In an implementation, the first capping pattern 181 may be in contact with each of the uppermost surface 121a of the first gate insulating layer 121 and the uppermost surface 111a of the first gate spacer 111.

The first capping pattern 181 may cover an upper surface of the first gate electrode G1. In an implementation, the first capping pattern 181 may be on the second conductive layer 140 and the third conductive layer 150. The first capping pattern 181 may include a portion that is (e.g., laterally) between the first gate insulating layer 121 and the second portion 150_2 of the third conductive layer 150 in the first gate trench GT1.

In an implementation, the first capping pattern 181 may completely fill a space between the first gate insulating layer 121 and the second portion 150_2 of the third conductive layer 150 in the first gate trench GT1. In an implementation, the first capping pattern 181 may be in contact with each of a sidewall and an upper surface of the second portion 150_2 of the third conductive layer 150. The first capping pattern 181 may be in contact with the uppermost surface 140a of the second conductive layer 140 exposed between the first gate insulating layer 121 and the second portion 150_2 of the third conductive layer 150. The first capping pattern 181 may be in contact with a sidewall of the first gate insulating layer 121 facing the sidewall of the second portion 150_2 of the third conductive layer 150.

The first capping pattern 181 may include, e.g., silicon nitride (SiN), silicon oxynitride (SiON), silicon oxide (SiO$_2$), silicon carbonitride (SiCN), silicon oxycarbonitride (SiOCN), or a combination thereof.

The second gate electrode G2 may include a fourth conductive layer 160 and a fifth conductive layer 170. The fourth conductive layer 160 may be on the second gate insulating layer 122 in the second gate trench GT2. The fourth conductive layer 160 may be on or along the sidewall and the bottom surface of the second gate trench GT2. The fourth conductive layer 160 may surround the second plurality of nanosheets NW2. In an implementation, the fourth conductive layer 160 may completely fill spaces between the second plurality of nanosheets NW2 on the second gate insulating layer 122. In an implementation, the fourth conductive layer 160 may completely fill spaces between the second active pattern 102 and the second plurality of nanosheets NW2 on the second gate insulating layer 122. The first conductive layer 130 may not be between the second plurality of nanosheets NW2. In an implementation, the fourth conductive layer 160 may not be between the first plurality of nanosheets NW1. In an implementation, the fourth conductive layer 160 may be conformally formed. The fourth conductive layer 160 may be in contact with the second gate insulating layer 122.

In an implementation, an uppermost surface 160a of the fourth conductive layer 160 may be lower than an uppermost surface 122a of the second gate insulating layer 122 and lower than an uppermost surface 112a of the second gate spacer 112. In an implementation, the uppermost surface 160a of the fourth conductive layer 160 may be higher than the uppermost surface 130a of the first conductive layer 130. In an implementation, the uppermost surface 160a of the fourth conductive layer 160 may be on the same plane as the uppermost surface 140a of the second conductive layer 140.

In an implementation, the fourth conductive layer 160 may include the same material as the second conductive layer 140. In an implementation, the fourth conductive layer 160 may include a material different from that of the first conductive layer 130. In an implementation, the fourth conductive layer 160 may include a metal or a metal carbide. In an implementation, the fourth conductive layer 160 may include titanium aluminum carbide (TiAlC). In an implementation, an amount of aluminum included in the fourth conductive layer 160 may be 20 at % to 40 at %. In an implementation, a thickness of the fourth conductive layer 160 may be the same as a thickness of the second conductive layer 140.

The fifth conductive layer 170 may be on the fourth conductive layer 160 in the second gate trench GT2. At least a portion of the fifth conductive layer 170 may be between portions of the fourth conductive layer 160. The fifth conductive layer 170 may be in contact with the fourth conductive layer 160. The fifth conductive layer 170 may include a first portion 170_1 between the portions of the fourth conductive layer 160, and a second portion 170_2 on the first portion 170_1.

The first portion 170_1 of the fifth conductive layer 170 may completely fill a space between the portions of the fourth conductive layer 160 in the second gate trench GT2. The second portion 170_2 of the fifth conductive layer 170 may be in contact with the first portion 170_1 of the fifth conductive layer 170. A width W4 of the second portion 170_2 of the fifth conductive layer 170 in the first horizontal direction DR1 may be the same as a width W3 of the first portion 170_1 of the fifth conductive layer 170 in the first horizontal direction DR1. In an implementation, the width W3 of the first portion 170_1 of the fifth conductive layer 170 in the first horizontal direction DR1 may be greater than the width W1 of the first portion 150_1 of the third conductive layer 150 in the first horizontal direction DR1. The second portion 170_2 of the fifth conductive layer 170 may be (e.g., laterally) spaced apart from the second gate insulating layer 122 in the first horizontal direction DR1 in the second gate trench GT2.

An upper surface 170a of the fifth conductive layer 170 may be higher than the uppermost surface 160a of the fourth conductive layer 160. In an implementation, the upper surface 170a of the second portion 170_2 of the fifth conductive layer 170 may be higher than the uppermost surface 160a of the fourth conductive layer 160. In an implementation, the upper surface 170a of the second portion 170_2 of the fifth conductive layer 170 may be on the same plane as the uppermost surface 122a of the second gate insulating layer 122 and may be on the same plane as the uppermost surface 112a of the second gate spacer 112. In an implementation, the upper surface 170a of the second portion 170_2 of the fifth conductive layer 170 may be to be lower than the uppermost surface 122a of the second gate insulating layer 122 and lower than the uppermost surface 112a of the second gate spacer 112. In an implementation, the upper surface 170a of the second portion 170_2 of the fifth conductive layer 170 may be on the same plane as the upper surface 150a of the second portion 150_2 of the third conductive layer 150.

In an implementation, the fifth conductive layer 170 may include the same material as the third conductive layer 150. In an implementation, the fifth conductive layer 170 may include a material different from that of the fourth conductive layer 160. The fifth conductive layer 170 may include a metal or a metal nitride. In an implementation, the fifth conductive layer 170 may include titanium nitride (TiN).

The second capping pattern 182 may extend in the second horizontal direction DR2 on the second gate electrode G2. In an implementation, the second capping pattern 182 may be in contact with each of the uppermost surface 122a of the second gate insulating layer 122 and the uppermost surface 112a of the second gate spacer 112.

The second capping pattern 182 may cover an upper surface of the second gate electrode G2. In an implementation, the second capping pattern 182 may be on the fourth conductive layer 160 and the fifth conductive layer 170. A portion of the second capping pattern 182 may be (e.g., laterally) between the second gate insulating layer 122 and the second portion 170_2 of the fifth conductive layer 170 in the second gate trench GT2.

In an implementation, the second capping pattern 182 may completely fill a space between the second gate insulating layer 122 and the second portion 170_2 of the fifth conductive layer 170 in the second gate trench GT2. In an implementation, the second capping pattern 182 may be in contact with each of a sidewall and an upper surface of the second portion 170_2 of the fifth conductive layer 170. The second capping pattern 182 may be in contact with the uppermost surface 160a of the fourth conductive layer 160 exposed between the second gate insulating layer 122 and the second portion 170_2 of the fifth conductive layer 170. The second capping pattern 182 may be in contact with a sidewall of the second gate insulating layer 122 facing the sidewall of the second portion 170_2 of the fifth conductive layer 170.

The second capping pattern 182 may include, e.g., silicon nitride (SiN), silicon oxynitride (SiON), silicon oxide (SiO$_2$), silicon carbonitride (SiCN), silicon oxycarbonitride (SiOCN), or a combination thereof.

The first interlayer insulating layer 190 may be on the field insulating layer 105. The first interlayer insulating layer 190 may surround each of the first and second source/drain regions SD1 and SD2. The first interlayer insulating layer 190 may surround a sidewall of each of the first and second gate spacers 111 and 112. In an implementation, an upper surface of the first interlayer insulating layer 190 may be on the same plane as an upper surface of each of the first and second capping patterns 181 and 182.

The first interlayer insulating layer 190 may include, e.g., silicon oxide, silicon nitride, silicon oxycarbide, silicon oxynitride, silicon oxycarbonitride, or a low-k material. The low-k material may include, e.g., fluorinated tetraethylortho-silicate (FTEOS), hydrogen silsesquioxane (HSQ), bis-ben-zocyclobutene (BCB), tetramethylorthosilicate (TMOS), octamethylcyclotetrasiloxane (OMCTS), hexamethyldisi-loxane (HMDS), trimethylsilyl borate (TMSB), diacetox-yditertiarybutosiloxane (DADBS), trimethylsilyl phosphate (TMSP), polytetrafluoroethylene (PTFE), Tonen Silazene (TOSZ), fluoride silicate glass (FSG), polyimide nanofoams such as polypropylene oxide, carbon doped silicon oxide (CDO), organo silicate glass (OSG), SiLK, amorphous fluo-rinated carbon, silica aerogels, silica xerogels, mesoporous silica, or combinations thereof.

The first gate contact CB1 may be on the first gate electrode G1. The first gate contact CB1 may penetrate through the first capping pattern 181 in the vertical direction DR3 to be electrically connected to the second portion 150_2 of the third conductive layer 150. The second gate contact CB2 may be on the second gate electrode G2. The second gate contact CB2 may penetrate through the second capping pattern 182 in the vertical direction DR3 to be electrically connected to the second portion 170_2 of the fifth conductive layer 170.

In an implementation, an upper surface of each of the first and second gate contacts CB1 and CB2 may be on the same plane as the upper surface of the first interlayer insulating layer 190. In an implementation, as illustrated in FIGS. 2 and 3, each of the first and second gate contacts CB1 and CB2 may be a single film. In an implementation, each of the first and second gate contacts CB1 and CB2 may be formed as multiple films. Each of the first and second gate contacts CB1 and CB2 may include a conductive material.

The etching stop layer 192 may be on the upper surface of each of the first interlayer insulating layer 190 and the first and second capping patterns 181 and 182. In an implementation, the etching stop layer 192 may be conformally formed. In an implementation, as illustrated in FIGS. 2 and 3, the etching stop layer 192 may be a single film. In an implementation, the etching stop layer 192 may be multiple films. The etching stop layer 192 may include, e.g., aluminum oxide, aluminum nitride, hafnium oxide, zirconium oxide, silicon oxide, silicon nitride, silicon oxynitride, or a low-k material.

The second interlayer insulating layer 195 may be on the etching stop layer 192. The second interlayer insulating layer 195 may include, e.g., silicon oxide, silicon nitride, silicon oxynitride, or a low-k material.

The first via V1 may penetrate through the second interlayer insulating layer 195 and the etching stop layer 192 in the vertical direction DR3 to be connected to the first gate contact CB1. The second via V2 may penetrate through the second interlayer insulating layer 195 and the etching stop layer 192 in the vertical direction DR3 to be connected to the second gate contact CB2. In an implementation, as illustrated in FIGS. 2 and 3, each of the first and second vias V1 and V2 may be a single film. In an implementation, each of the first and second vias V1 and V2 may be multiple films. Each of the first and second vias V1 and V2 may include a conductive material.

In the semiconductor device according to some exemplary embodiments of the present disclosure, reliability of an electrical connection relationship between the conductive layer including titanium nitride (TiN) and the gate contacts CB1 and CB2 may be improved by etching a portion of the conductive layer including titanium aluminum carbide (TiAlC) in the gate electrodes G1 and G2 to lower a height of the conductive layer including titanium aluminum carbide (TiAlC).

Hereinafter, a method of manufacturing a semiconductor device according to some exemplary embodiments of the present disclosure will be described with reference to FIGS. 2 to 25.

FIGS. 4 to 25 are views of stages in a method of manufacturing a semiconductor device according to some exemplary embodiments of the present disclosure.

Figure 4:
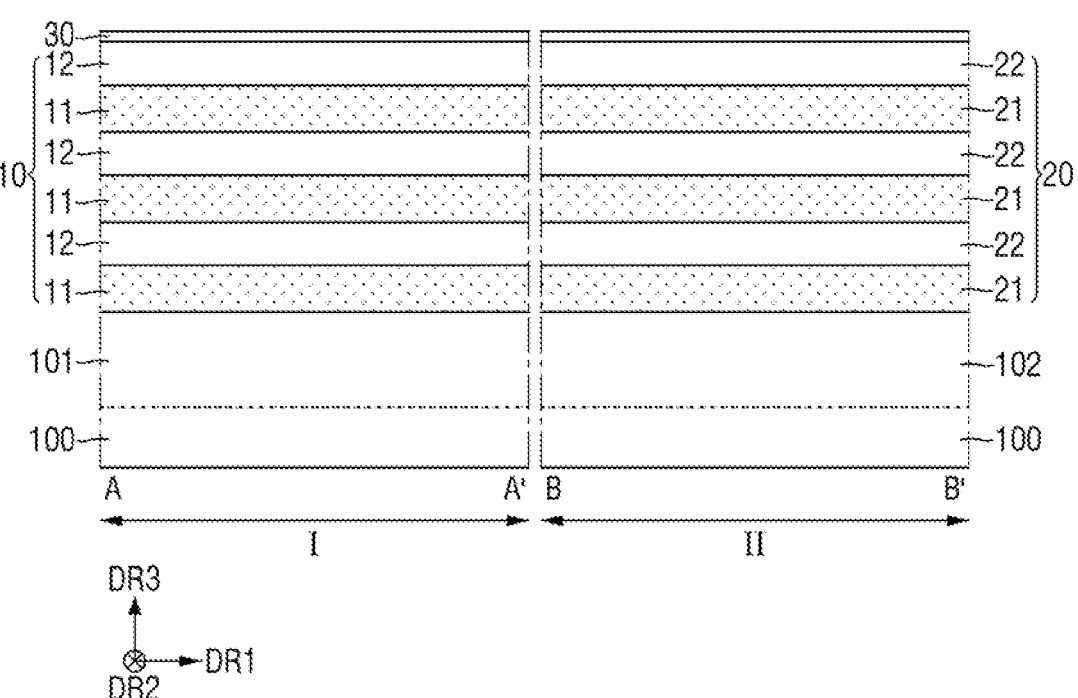
Figure 5:
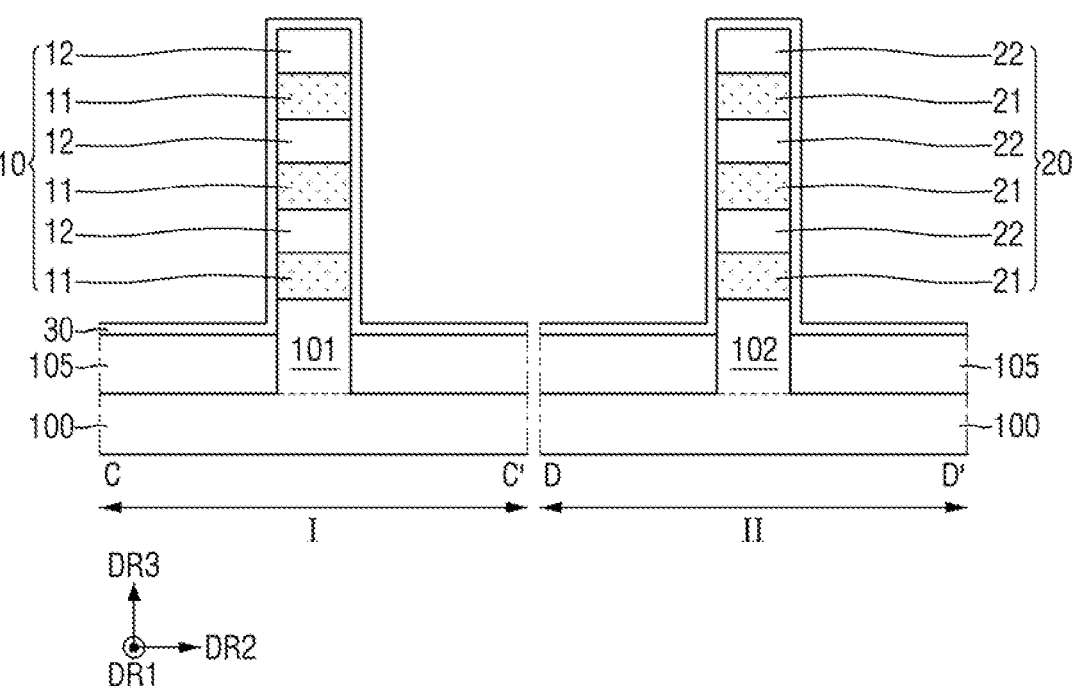

Referring to FIGS. 4 and 5, a first stacked structure 10 may be formed on the first region I of the substrate 100, and a second stacked structure 20 may be formed on the second region II of the substrate 100. The first stacked structure 10 and the second stacked structure 20 may be formed through the same manufacturing process. The first stacked structure 10 may include a first sacrificial layer 11 and a first semiconductor layer 12 alternately stacked on the first region I of the substrate 100. In an implementation, the first sacrificial layer 11 may be formed at the lowermost portion of the first stacked structure 10, and the first semiconductor layer 12 may be formed at the uppermost portion of the first stacked structure 10. In an implementation, the first sacrificial layer 11 may also be formed at the uppermost portion of the first stacked structure 10.

In an implementation, the second stacked structure 20 may include a second sacrificial layer 21 and a second semiconductor layer 22 alternately stacked on the second region II of the substrate 100. In an implementation, the second sacrificial layer 21 may be formed at the lowermost portion of the second stacked structure 20, and the second semiconductor layer 22 may be formed at the uppermost portion of the second stacked structure 20. In an implementation, the second sacrificial layer 21 may also be formed at the uppermost portion of the second stacked structure 20.

Each of the first sacrificial layer 11 and the second sacrificial layer 21 may include, e.g., silicon germanium (SiGe). Each of the first semiconductor layer 12 and the second semiconductor layer 22 may include, e.g., silicon (Si).

Subsequently, a portion of each of the first stacked structure 10 and the second stacked structure 20 may be etched. A portion of the substrate 100 may also be etched while each of the first and second stacked structures 10 and 20 is etched. Through such an etching processing, a first active pattern 101 may be defined on a lower side of the first stacked structure 10 on the first region I of the substrate 100, and a second active pattern 102 may be defined on a lower side of the second stacked structure 20 on the second region II of the substrate 100.

Subsequently, a field insulating layer 105 surrounding a sidewall of each of the first active pattern 101 and the second active pattern 102 may be formed. In an implementation, an upper surface of each of the first active pattern 101 and the second active pattern 102 may be formed to be higher than an upper surface of the field insulating layer 105.

Subsequently, a pad oxide layer 30 may be formed to cover the upper surface of the field insulating layer 105, the exposed sidewall of each of the first and second active patterns 101 and 102, a sidewall and an upper surface of the first stacked structure 10, and a sidewall and an upper surface of the second stacked structure 20. In an implementation, the pad oxide layer 30 may be conformally formed. The pad oxide layer 30 may include, e.g., silicon oxide (SiO$_2$).

Figure 6:
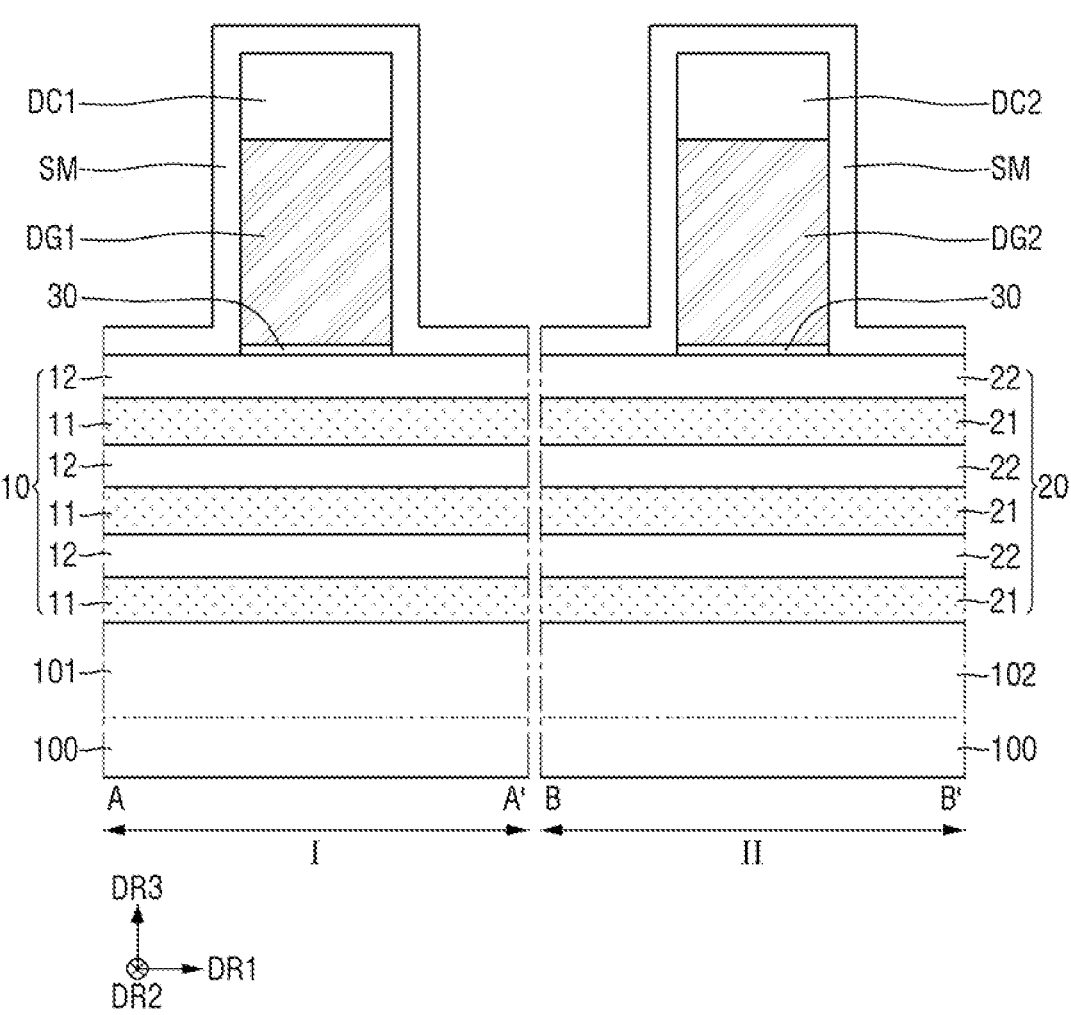
Figure 7:
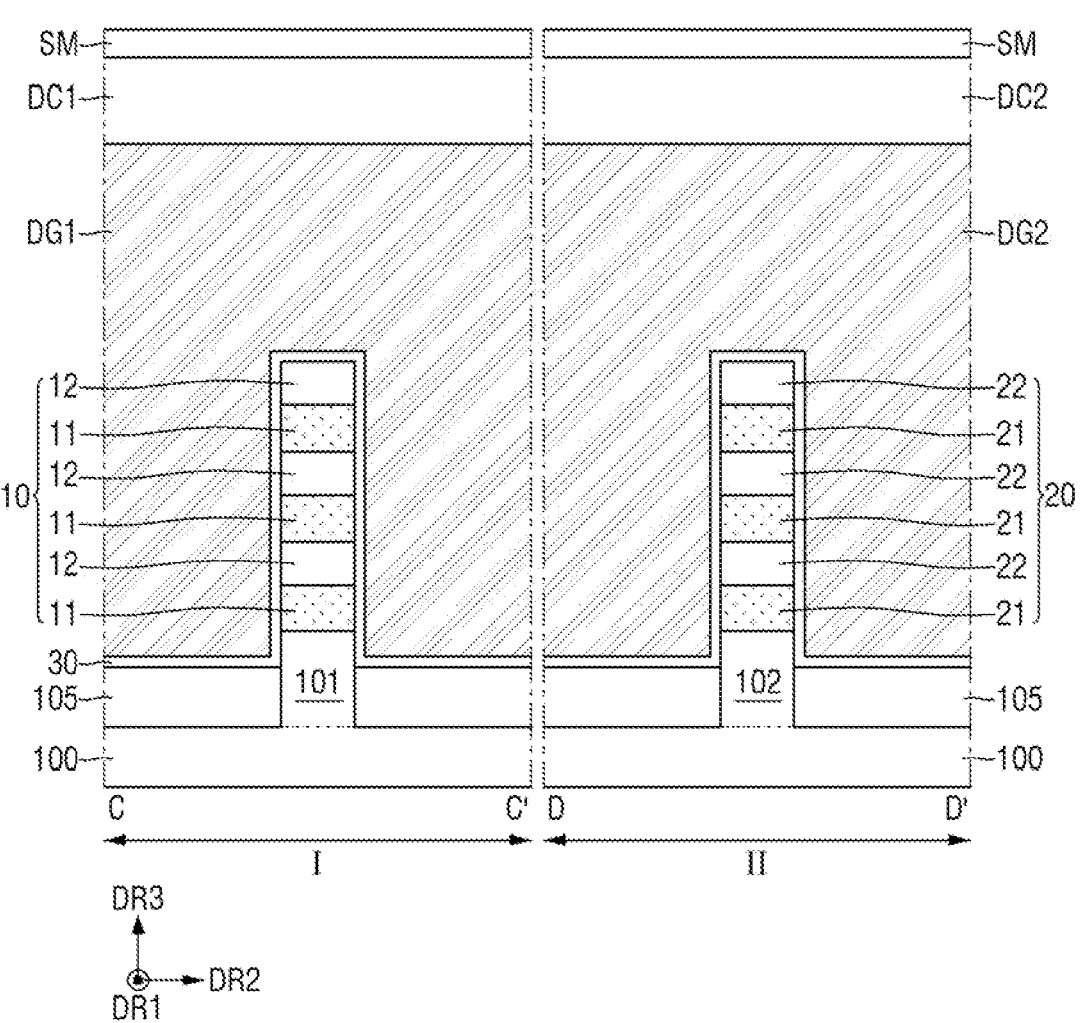

Referring to FIGS. 6 and 7, a first dummy gate DG1 and a first dummy capping pattern DC1 extending in the second horizontal direction DR2 may be formed on the pad oxide layer 30 on the first stacked structure 10 and the field insulating layer 105. The first dummy capping pattern DC1 may be formed on the first dummy gate DG1. While the first dummy gate DG1 and the first dummy capping pattern DC1 are formed, the remaining pad oxide layer 30 except for a portion overlapping the first dummy gate DG1 in the vertical direction DR3 on the first region I of the substrate 100 may be removed.

In an implementation, a second dummy gate DG2 and a second dummy capping pattern DC2 extending in the second horizontal direction DR2 may be formed on the pad oxide layer 30 on the second stacked structure 20 and the field insulating layer 105. The second dummy capping pattern DC2 may be formed on the second dummy gate DG2. While the second dummy gate DG2 and the second dummy capping pattern DC2 are formed, the remaining pad oxide layer 30 except for a portion overlapping the second dummy gate DG2 in the vertical direction DR3 on the second region II of the substrate 100 may be removed.

Subsequently, a spacer material layer SM may be formed to cover a sidewall of each of the first and second dummy gates DG1 and DG2, a sidewall and an upper surface of each of the first and second dummy capping patterns DC1 and DC2, the exposed sidewall and upper surface of the first stacked structure 10, and the exposed sidewall and upper surface of the second stacked structure 20. In an implementation, the spacer material layer SM may also be formed on the exposed upper surface of the field insulating layer 105.

In an implementation, the spacer material layer SM may be conformally formed. The spacer material layer SM may include, e.g., silicon nitride (SiN), silicon oxycarbonitride (SiOCN), silicon boron carbonitride (SiBCN), silicon carbonitride (SiCN), silicon oxynitride (SiON), or combinations thereof.

Figure 8:
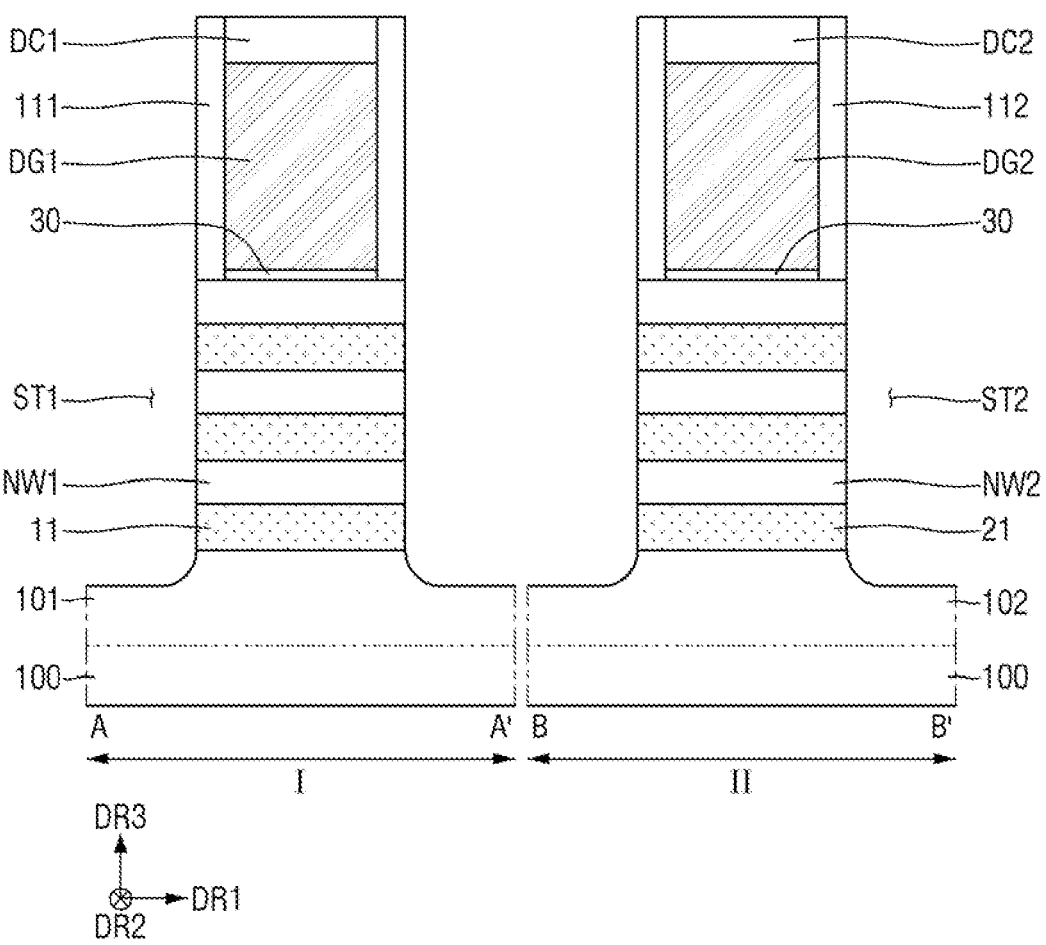

Referring to FIG. 8, a first source/drain trench ST1 may be formed by etching the first stacked structure (10 in FIG. 6) using the first dummy capping pattern DC1 and the first dummy gate DG1 as a mask. In an implementation, the first source/drain trench ST1 may extend into the first active pattern 101. In an implementation, a second source/drain trench ST2 may be formed by etching the second stacked structure (20 in FIG. 6) using the second dummy capping pattern DC2 and the second dummy gate DG2 as a mask. In an implementation, the second source/drain trench ST2 may extend into the second active pattern 102.

While the first and second source/drain trenches ST1 and ST2 are formed, the spacer material layer (SM in FIG. 6) formed on the upper surface of each of the first and second dummy capping patterns DC1 and DC2 and a portion of each of the first and second dummy capping patterns DC1 and DC2 may be removed. The spacer material layer (SM in FIG. 6) remaining on the sidewall of each of the first dummy gate DG1 and the first dummy capping pattern DC1 may be defined as a first gate spacer 111. In an implementation, the spacer material layer (SM in FIG. 6) remaining on the sidewall of each of the second dummy gate DG2 and the second dummy capping pattern DC2 may be defined as a second gate spacer 112.

After the first source/drain trench ST1 is formed, the first semiconductor layer (12 in FIG. 6) remaining on a lower side of the first dummy gate DG1 may be defined as a first plurality of nanosheets NW1. In an implementation, after the second source/drain trench ST2 is formed, the second semiconductor layer (22 in FIG. 6) remaining on a lower side of the second dummy gate DG2 may be defined as a second plurality of nanosheets NW2.

Figure 9:
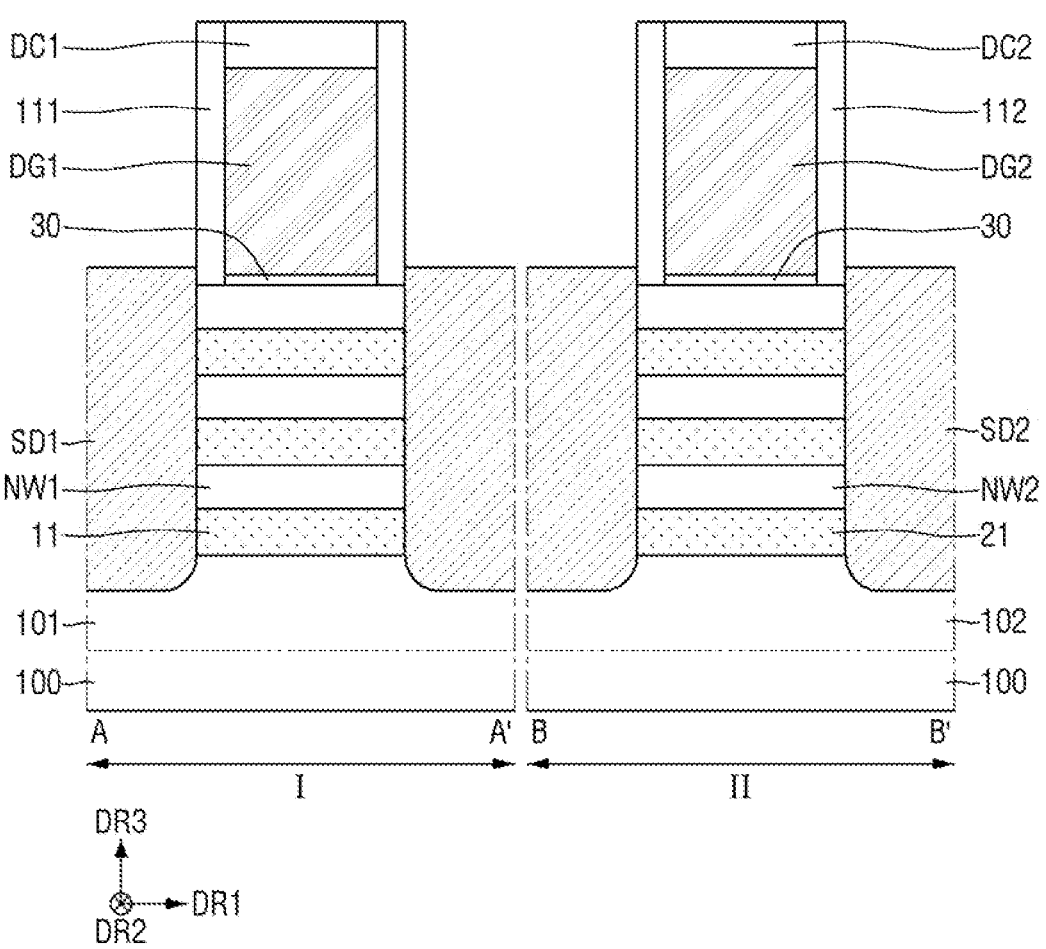

Referring to FIG. 9, a first source/drain region SD1 may be formed in the first source/drain trench (ST1 in FIG. 8), and a second source/drain region SD2 may be formed in the second source/drain trench (ST2 of FIG. 8).

Figure 10:
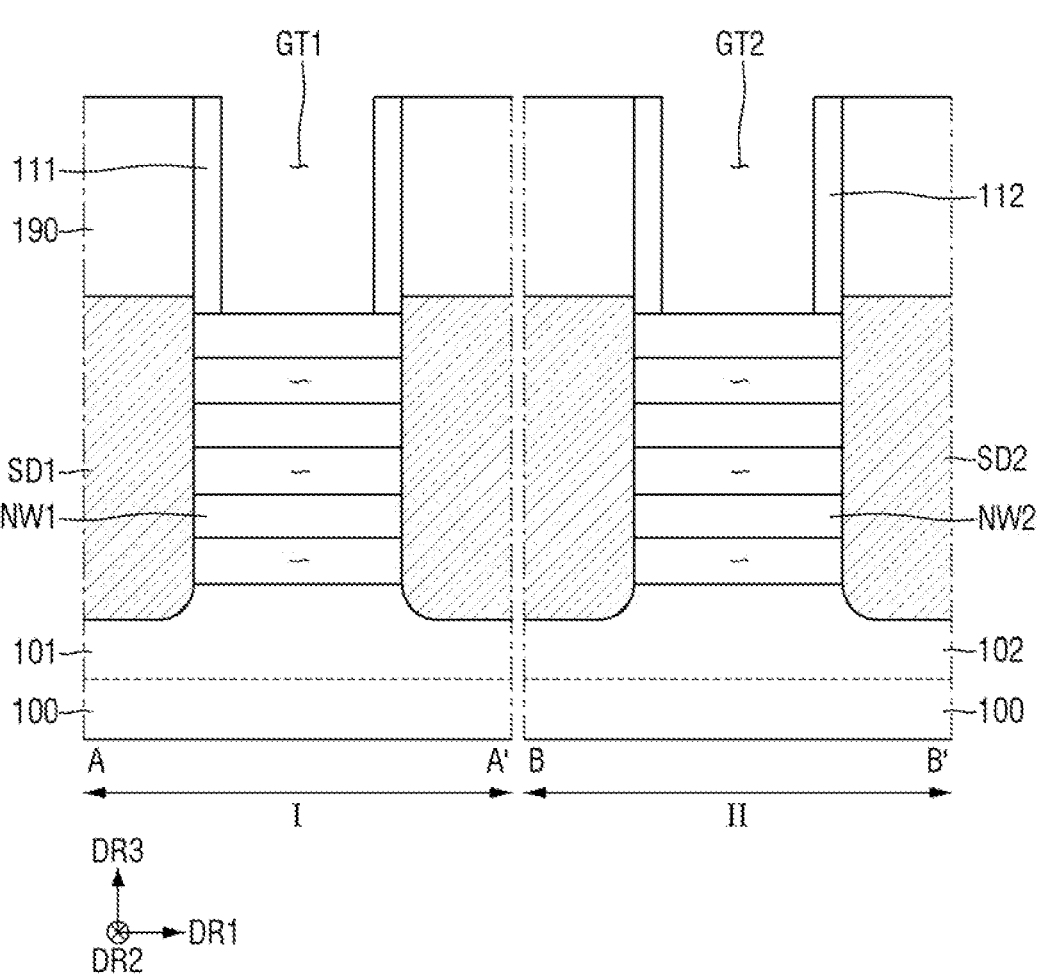
Figure 11:
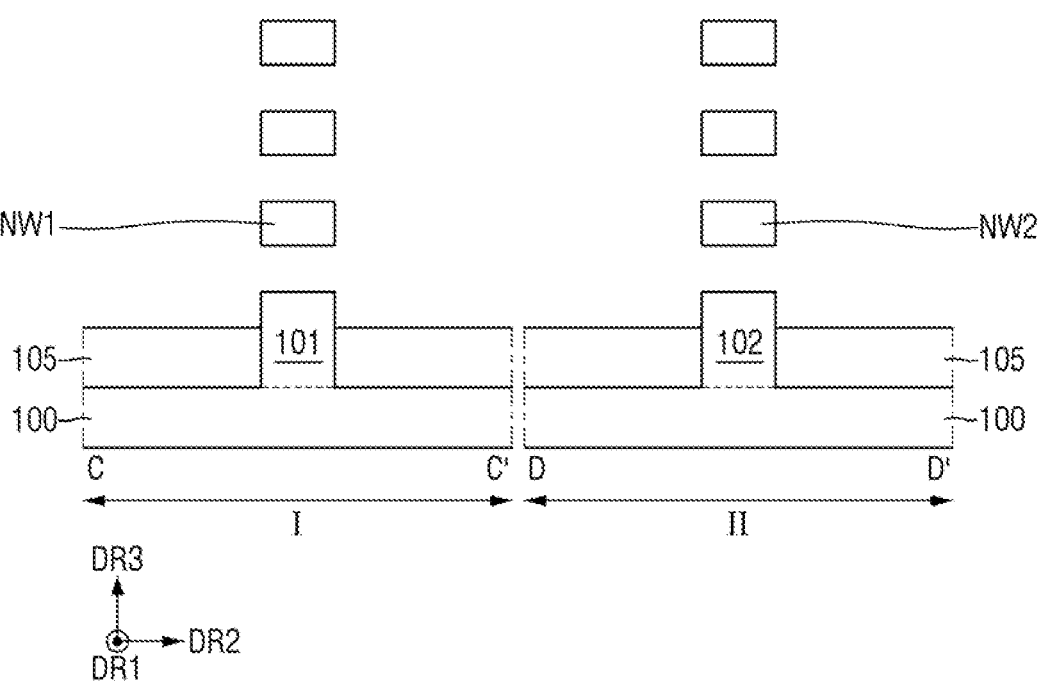

Referring to FIGS. 10 and 11, a first interlayer insulating layer 190 may be formed to cover each of the first and second source/drain regions SD1 and SD2, the first and second gate spacers 111 and 112, and the first and second dummy capping patterns (DC1 and DC2 in FIG. 9). Subsequently, an upper surface of each of the first and second dummy gates (DG1 and DG2 in FIG. 9) may be exposed through a planarization process. Subsequently, each of the first and second dummy gates (DG1 and DG2 in FIG. 9), the pad oxide layer (30 in FIG. 9), the first sacrificial layer (11 in FIG. 9), and the second sacrificial layer (21 of FIG. 9) may be removed. A portion from which the first dummy gate (DG1 in FIG. 9) is removed may be defined as a first gate trench GT1, and a portion from which the second dummy gate (DG2 in FIG. 9) is removed may be defined as a second gate trench GT2.

Figure 12:
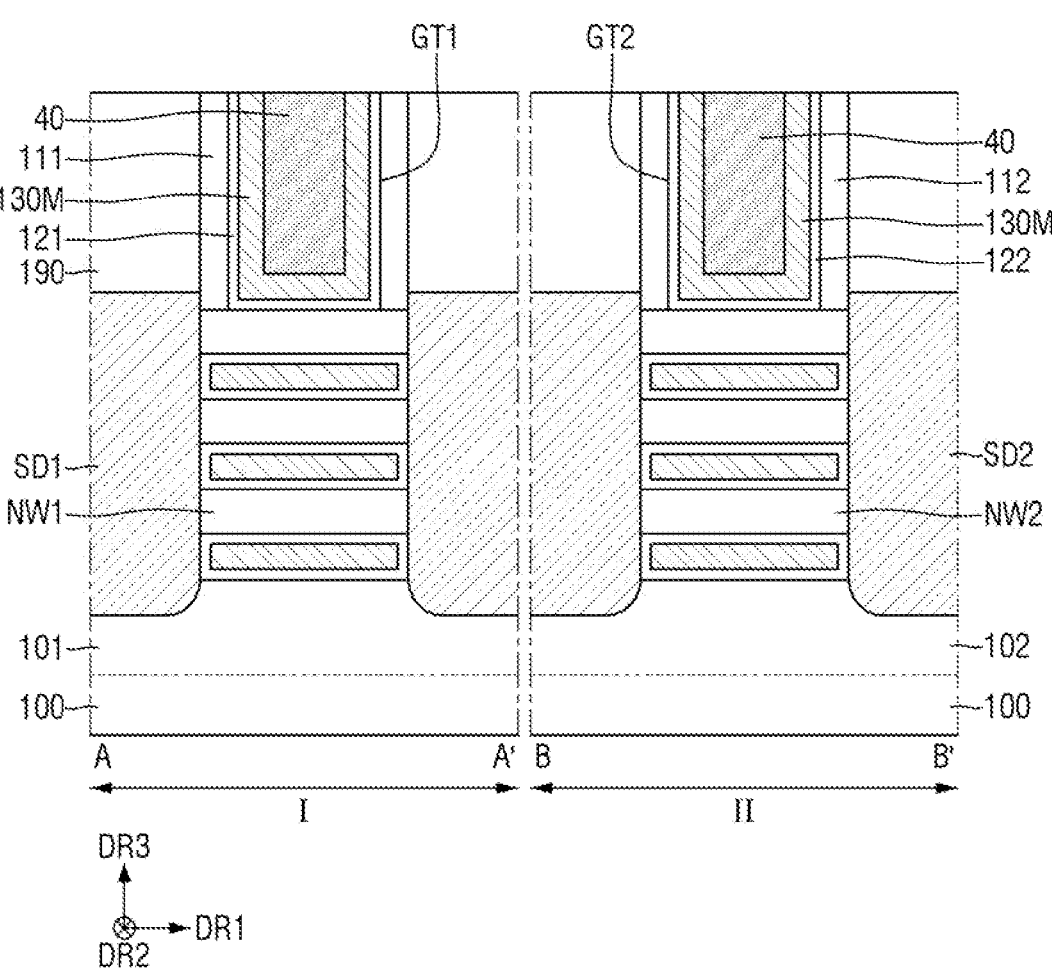
Figure 13:
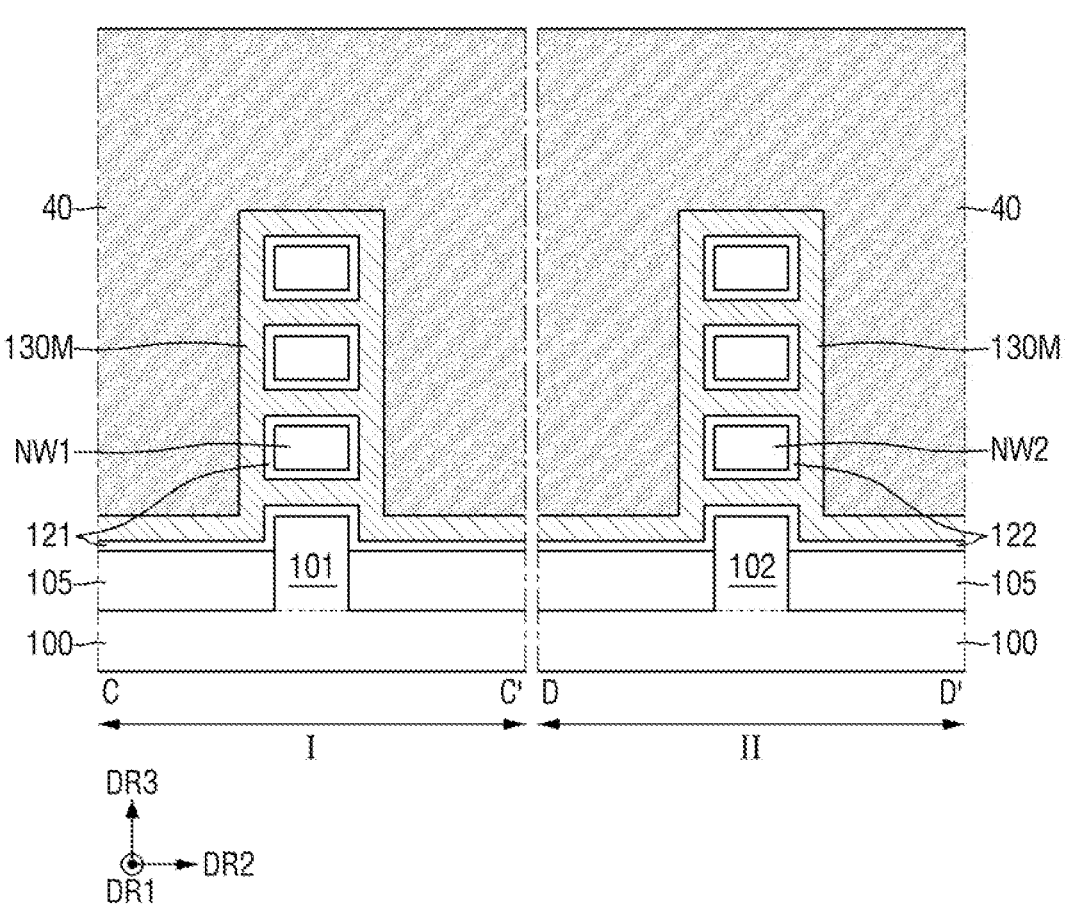

Referring to FIGS. 12 and 13, a first gate insulating layer 121 may be formed in a portion from which the first dummy gate (DG1 in FIG. 9) and the first sacrificial layer (11 in FIG. 9) have been removed. In an implementation, a second gate insulating layer 122 may be formed in a portion from which the second dummy gate (DG2 in FIG. 9) and the second sacrificial layer (21 in FIG. 9) have been removed.

Subsequently, a first conductive material layer 130M may be formed on each of the first gate insulating layer 121 and the second gate insulating layer 122. In an implementation, the first conductive material layer 130M may be conformally formed. The first conductive material layer 130M may be formed along a sidewall and a bottom surface of each of the first gate trench GT1 and the second gate trench GT2. The first conductive material layer 130M may completely fill a portion from which the first sacrificial layer (11 in FIG. 9) and the second sacrificial layer (21 in FIG. 9) have been removed; In an implementation, the first conductive layer 130 may include titanium aluminum nitride (TiAlN).

Subsequently, a first passivation layer 40 may be formed on the first conductive material layer 130M to completely fill the inside of each of the first and second gate trenches GT1 and GT2. In an implementation, the first passivation layer 40 may include, e.g., SOH.

Figure 14:
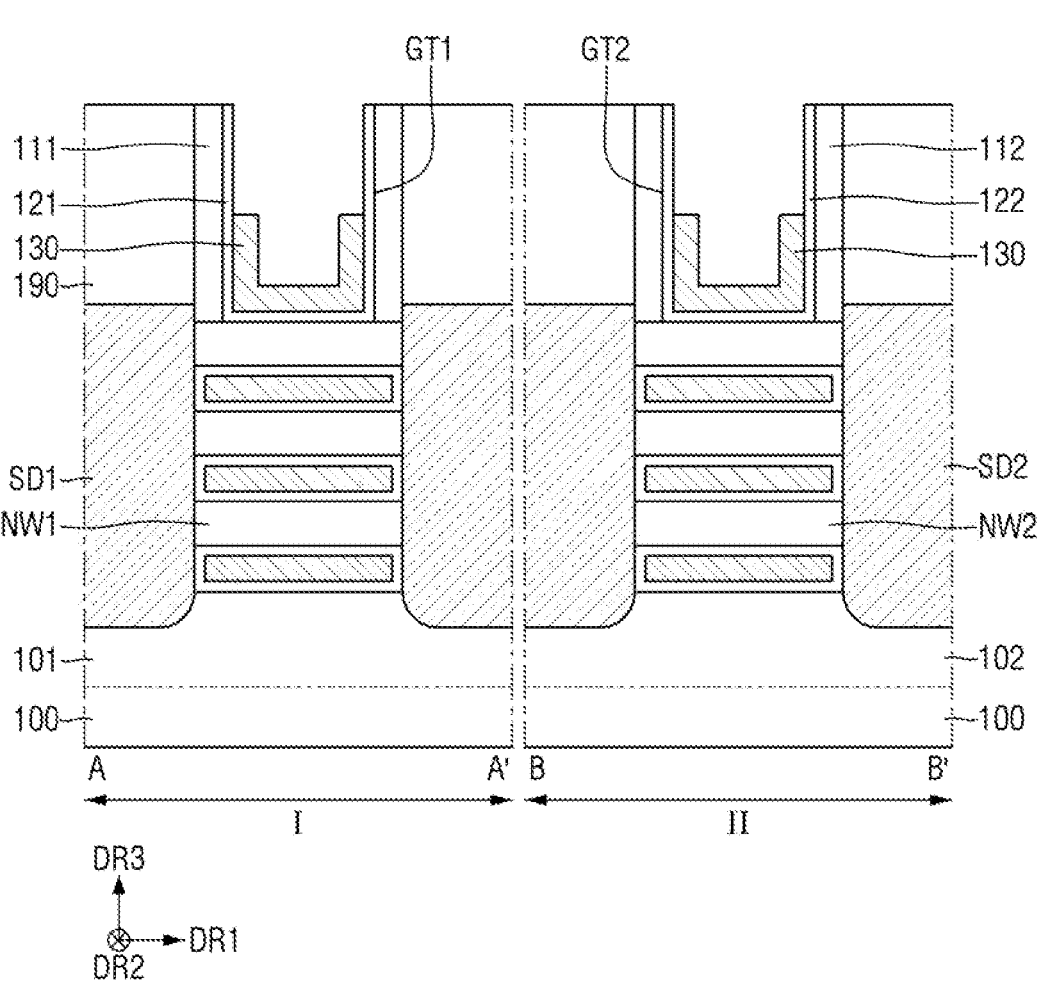
Figure 15:
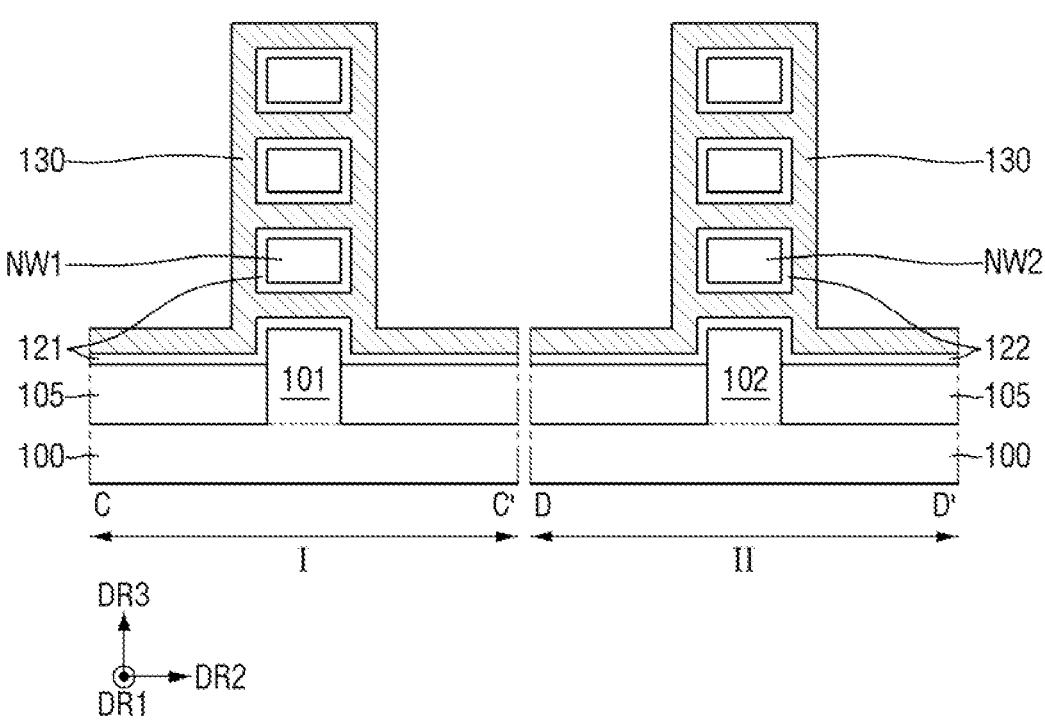

Referring to FIGS. 14 and 15, each of a portion of the first conductive material layer (130M in FIG. 12) and a portion of the first passivation layer (40 in FIG. 12) may be etched inside each of the first and second gate trenches GT1 and GT2. After such an etching process, the first conductive material layer (130M in FIG. 12) remaining in each of the first and second gate trenches GT1 and GT2 may be defined as a first conductive layer 130. An upper surface of the first conductive layer 130 may be lower than an upper surface of each of the first and second gate spacers 111 and 112 and lower than an upper surface of each of the first and second gate insulating layers 121 and 122. Subsequently, the first passivation layer (40 in FIG. 12) remaining inside each of the first and second gate trenches GT1 and GT2 may be removed.

Figure 16:
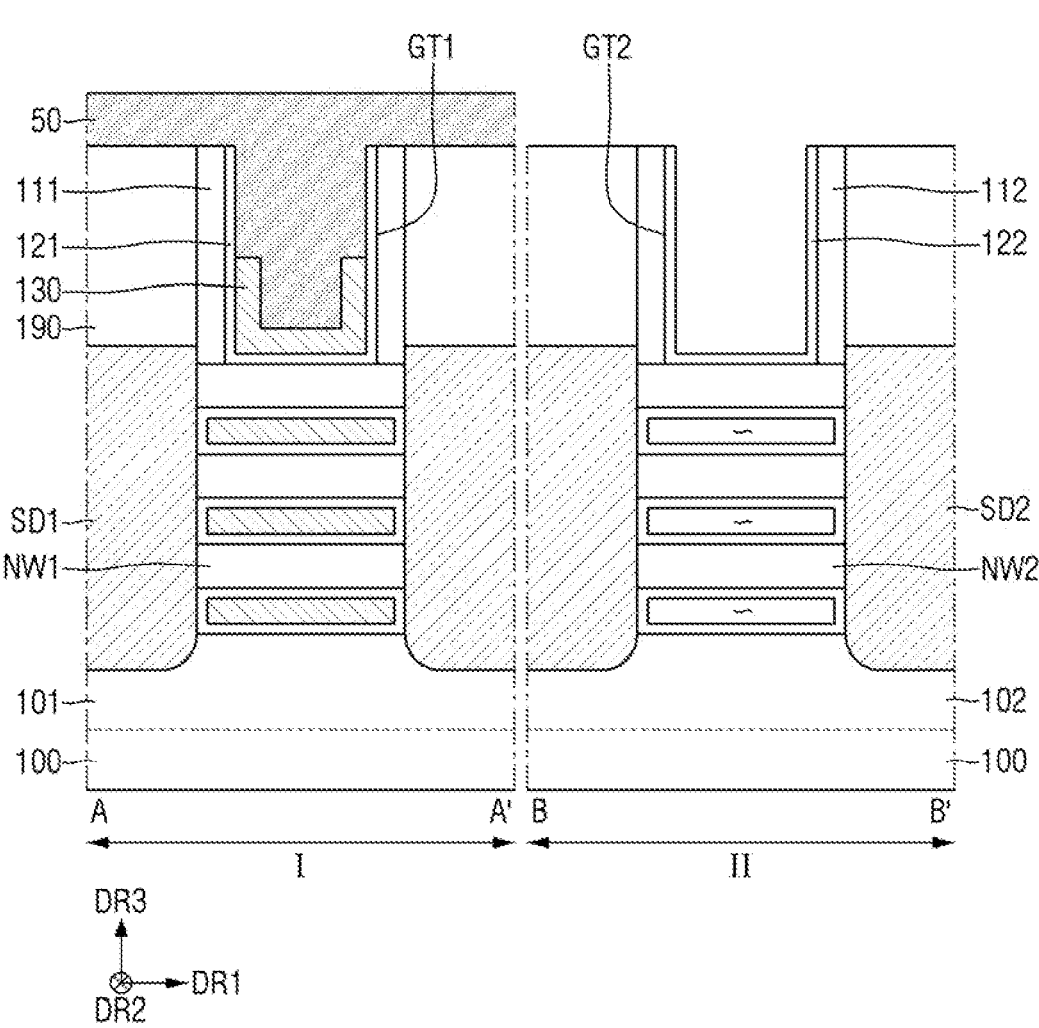
Figure 17:
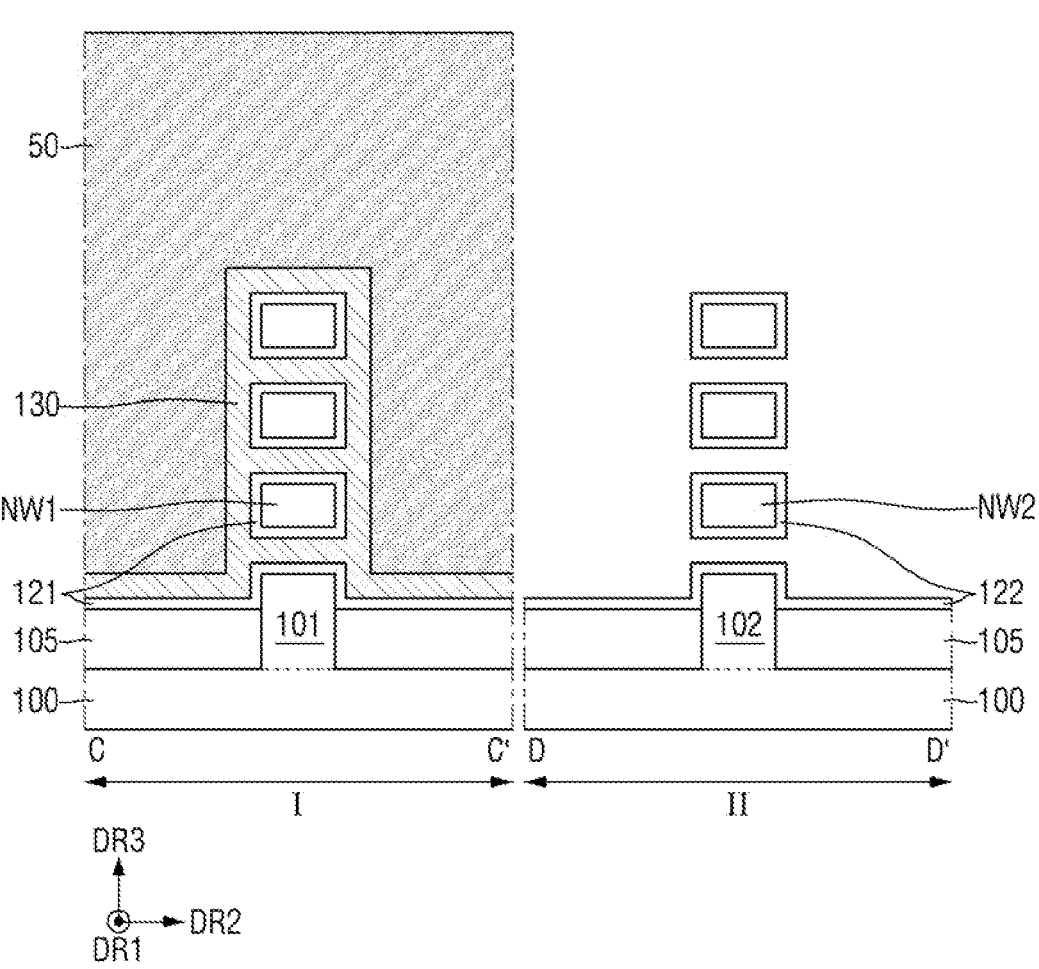

Referring to FIGS. 16 and 17, a second passivation layer 50 may be formed on the first region I of the substrate 100. In an implementation, the second passivation layer 50 may completely fill the inside of the first gate trench GT1. In an implementation, the second passivation layer 50 may also be formed on the first interlayer insulating layer 190 formed on the first region I of the substrate 100. In an implementation, the second passivation layer 50 may include, e.g., SOH. Subsequently, the first conductive layer 130 formed on the second region II of the substrate 100 may be removed. Accordingly, the second gate insulating layer 122 may be exposed.

Figure 18:
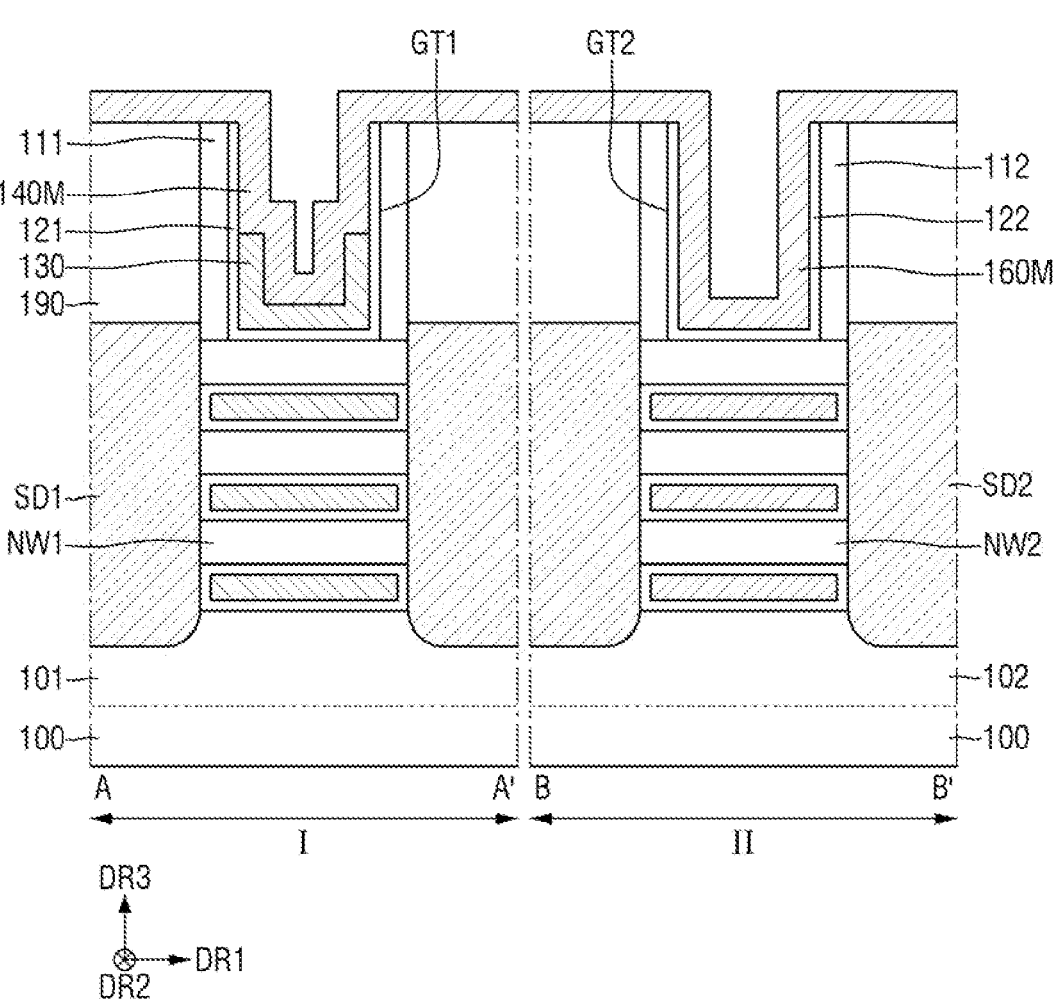
Figure 19:
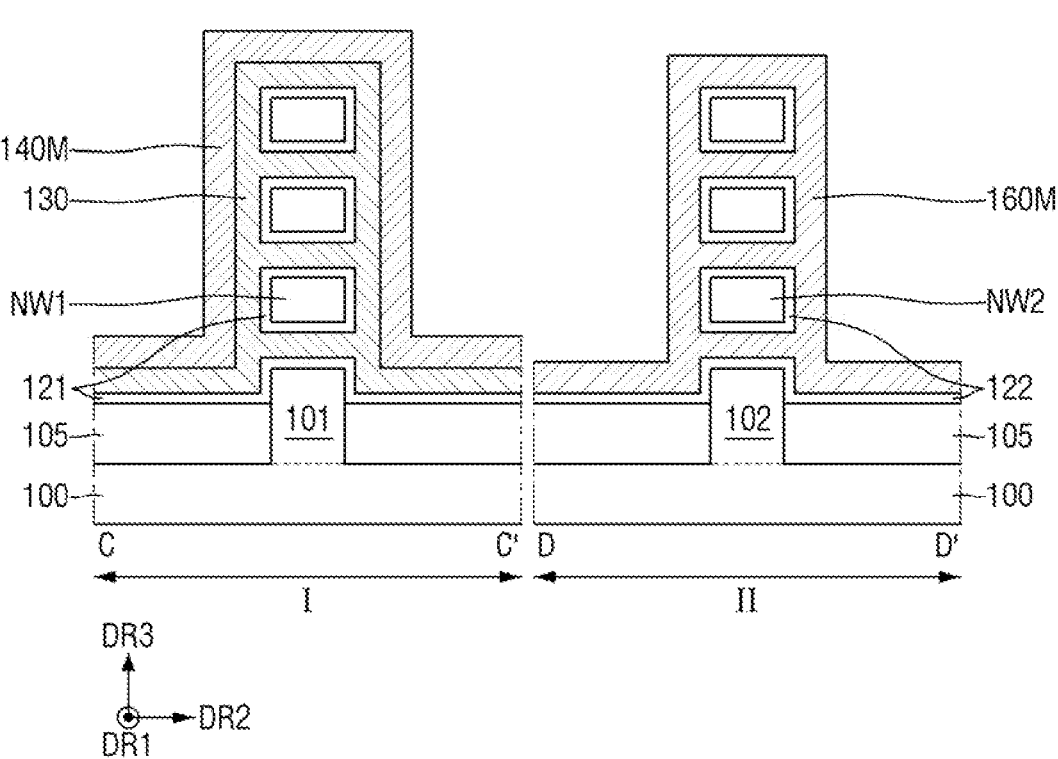

Referring to FIGS. 18 and 19, a second conductive material layer 140M may be formed on the first conductive layer 130 and the first gate insulating layer 121 in the first gate trench GT1. The second conductive material layer 140M may be in contact with the first gate insulating layer 121 on the first conductive layer 130. The second conductive material layer 140M may also be formed on the upper surface of the first gate spacer 111, the uppermost surface of the first gate insulating layer 121, and the upper surface of the first interlayer insulating layer 190. In an implementation, the second conductive material layer 140M may be conformally formed.

In an implementation, a third conductive material layer 160M may be formed on the second gate insulating layer 122 in the second gate trench GT2. The third conductive material layer 160M may be in contact with the second gate insulating layer 122. The third conductive material layer 160M may completely fill the spaces between the second plurality of nanosheets NW2. In an implementation, the third conductive material layer 160M may completely fill the spaces between the second active pattern 102 and the second plurality of nanosheets NW2. The third conductive material layer 160M may also be formed on the upper surface of the second gate spacer 112, the uppermost surface of the second gate insulating layer 122, and the upper surface of the first interlayer insulating layer 190. In an implementation, the third conductive material layer 160M may be conformally formed.

The second conductive material layer 140M and the third conductive material layer 160M may be formed through or by the same manufacturing process. In an implementation, the second conductive material layer 140M and the third conductive material layer 160M may include the same material. In an implementation, the second conductive material layer 140M and the third conductive material layer 160M may include titanium aluminum carbide (TiAlC).

Figure 20:
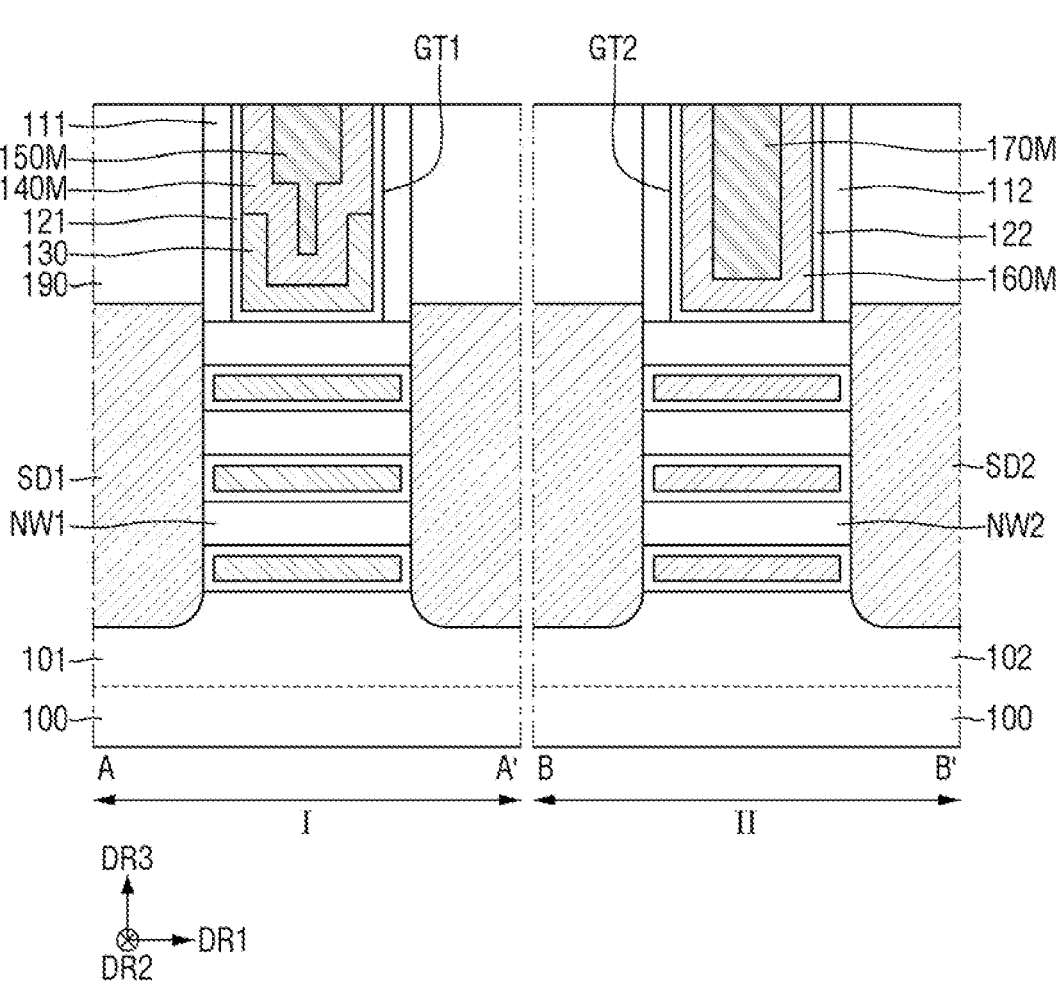
Figure 21:
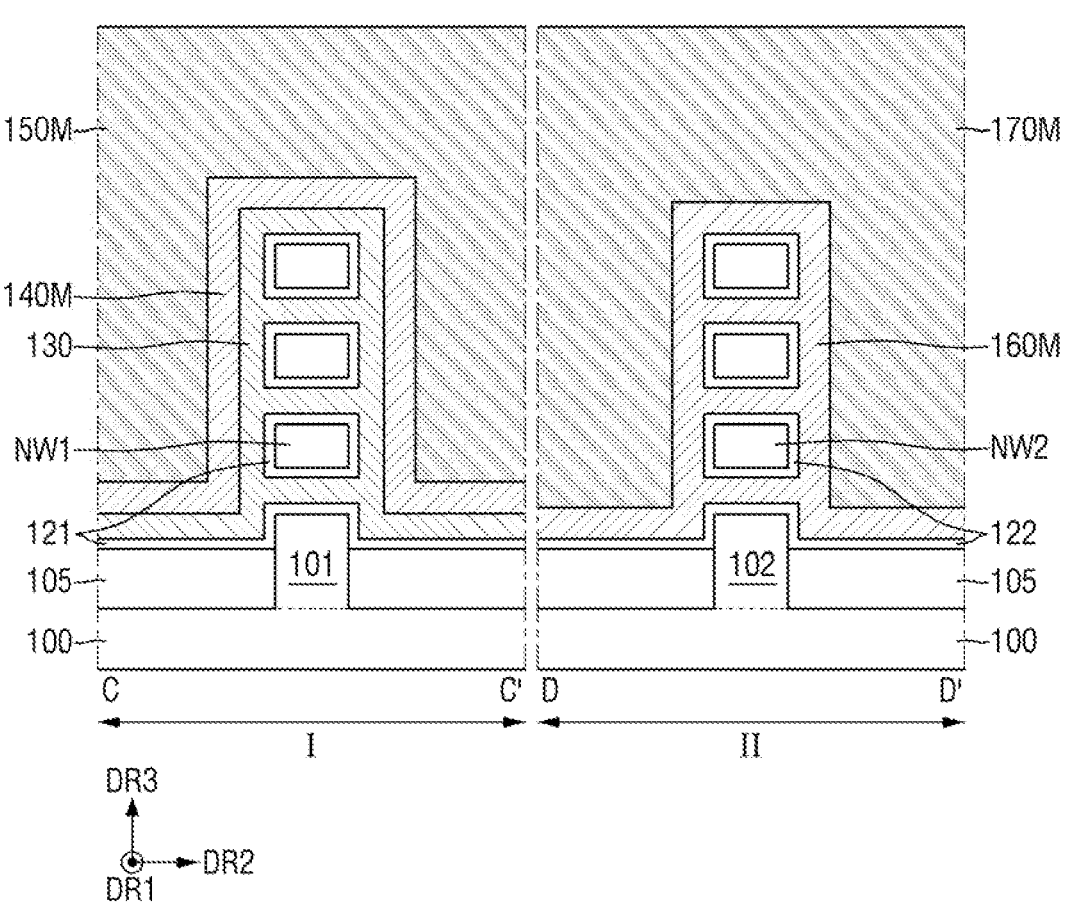

Referring to FIGS. 20 and 21, a fourth conductive material layer 150M may be formed on the second conductive material layer 140M. The fourth conductive material layer 150M may completely fill the inside (e.g., remaining open parts) of the first gate trench GT1 on the second conductive material layer 140M. In addition, a fifth conductive material layer 170M may be formed on the third conductive material layer 160M. The fifth conductive material layer 170M may completely fill the inside (e.g., remaining open parts) of the second gate trench GT2 on the third conductive material layer 160M.

The fourth conductive material layer 150M and the fifth conductive material layer 170M may be formed through the same manufacturing process. In an implementation, the fourth conductive material layer 150M and the fifth conductive material layer 170M may include the same material. In an implementation, the fourth conductive material layer 150M and the fifth conductive material layer 170M may include titanium nitride (TiN).

Subsequently, the upper surface of the first interlayer insulating layer 190, the upper surface of each of the first and second gate spacers 111 and 112, and the uppermost surface of each of the first and second gate insulating layers 121 and 122 may be exposed through a planarization process.

Figure 22:
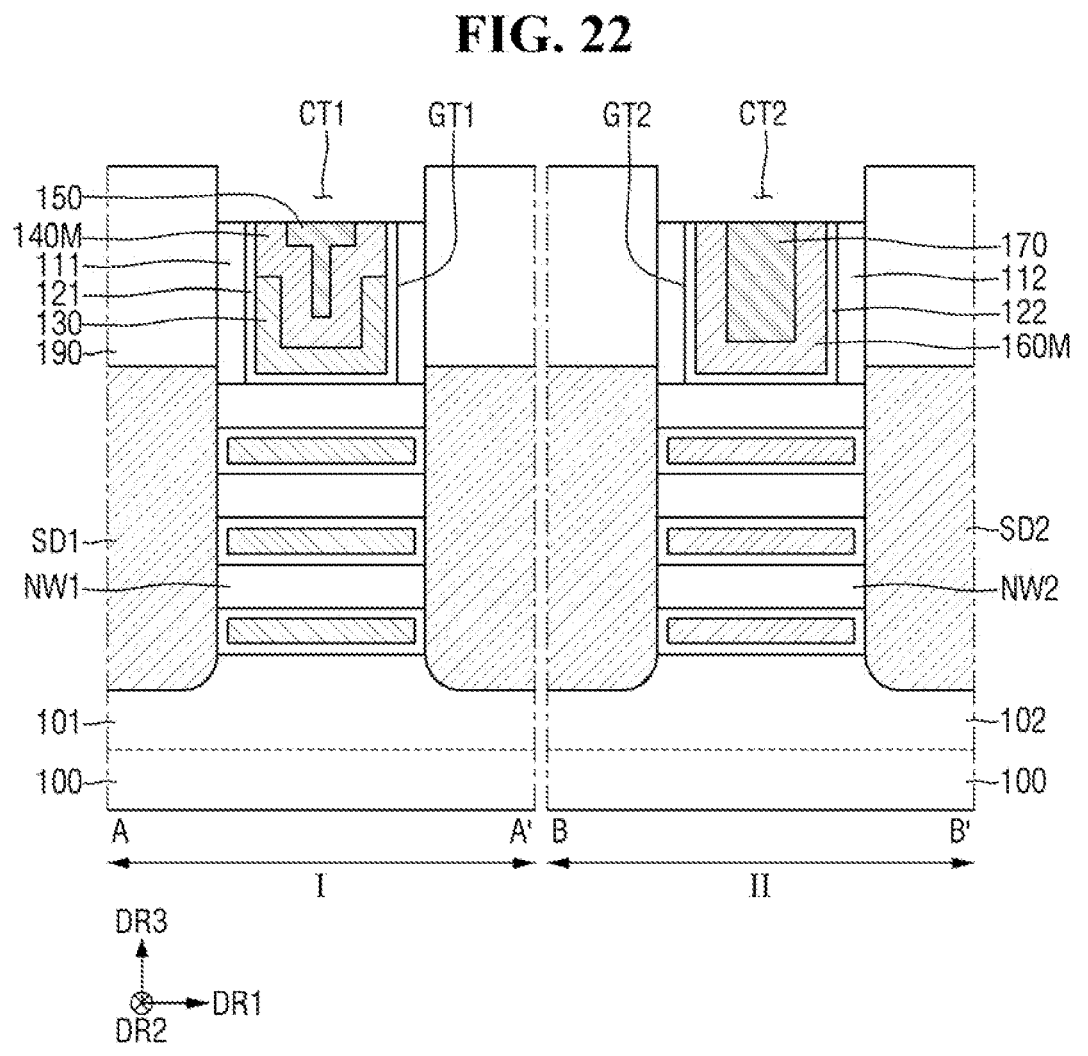

Referring to FIG. 22, each of an upper side of the first gate spacer 111, an upper side of the first gate insulating layer 121, an upper side of the second conductive material layer 140M, and an upper side of the fourth conductive material layer (150M in FIG. 20) may be etched to form a first capping pattern trench CT1. After such an etching process, the remaining fourth conductive material layer (150M in FIG. 20) may be defined as a third conductive layer 150.

In addition, each of an upper side of the second gate spacer 112, an upper side of the second gate insulating layer 122, an upper side of the third conductive material layer 160M, and an upper side of the fifth conductive material layer (170M in FIG. 20) may be etched to form a second capping pattern trench CT2. After such an etching process, the remaining fifth conductive material layer (170M in FIG. 20) may be defined as a fifth conductive layer 170.

Figure 23:
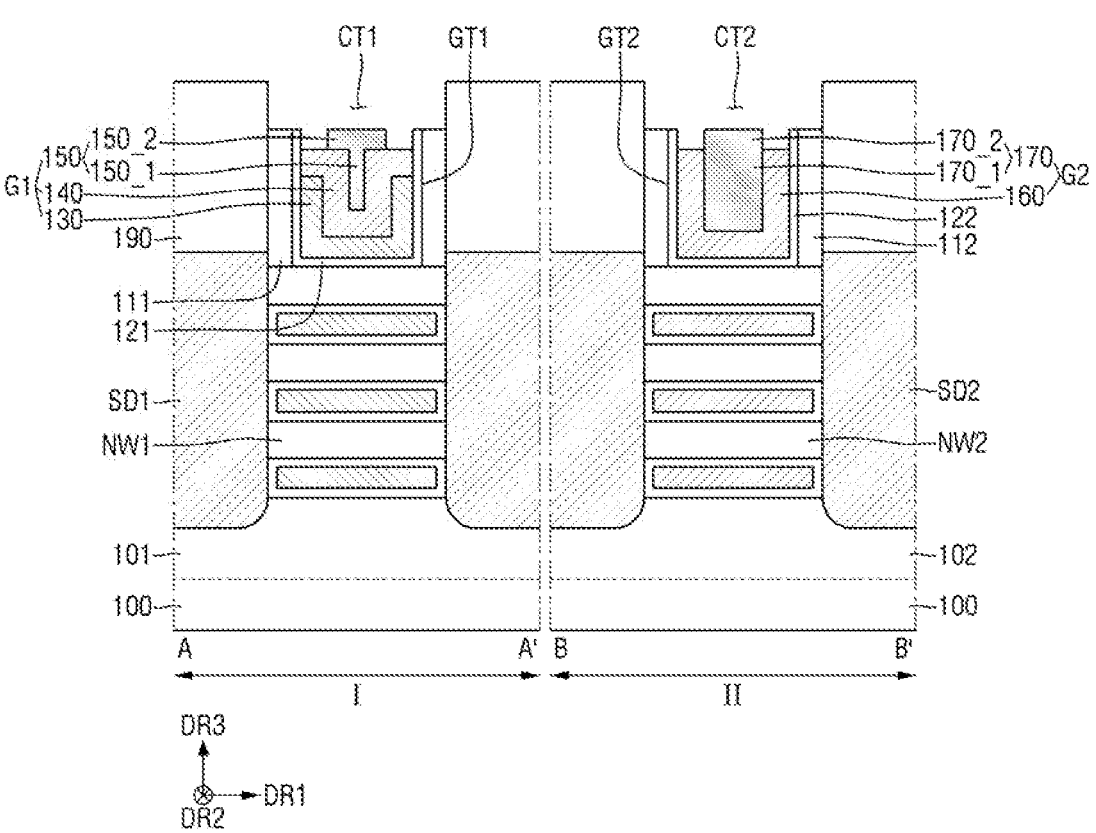

Referring to FIG. 23, portions of the second conductive material layer (140M in FIG. 22) between the second portion 150_2 of the third conductive layer 150 and the first gate insulating layer 121 may be etched through a selective etching process. After such an etching process, the remaining second conductive material layer (140M in FIG. 22) may be defined as a second conductive layer 140.

In an implementation, portions of the third conductive material layer (160M in FIG. 22) between the second portion 170_2 of the fifth conductive layer 170 and the second gate insulating layer 122 may be etched through a selective etching process. After such an etching process, the remaining third conductive material layer (160M in FIG. 22) may be defined as a fourth conductive layer 160.

Figure 24:
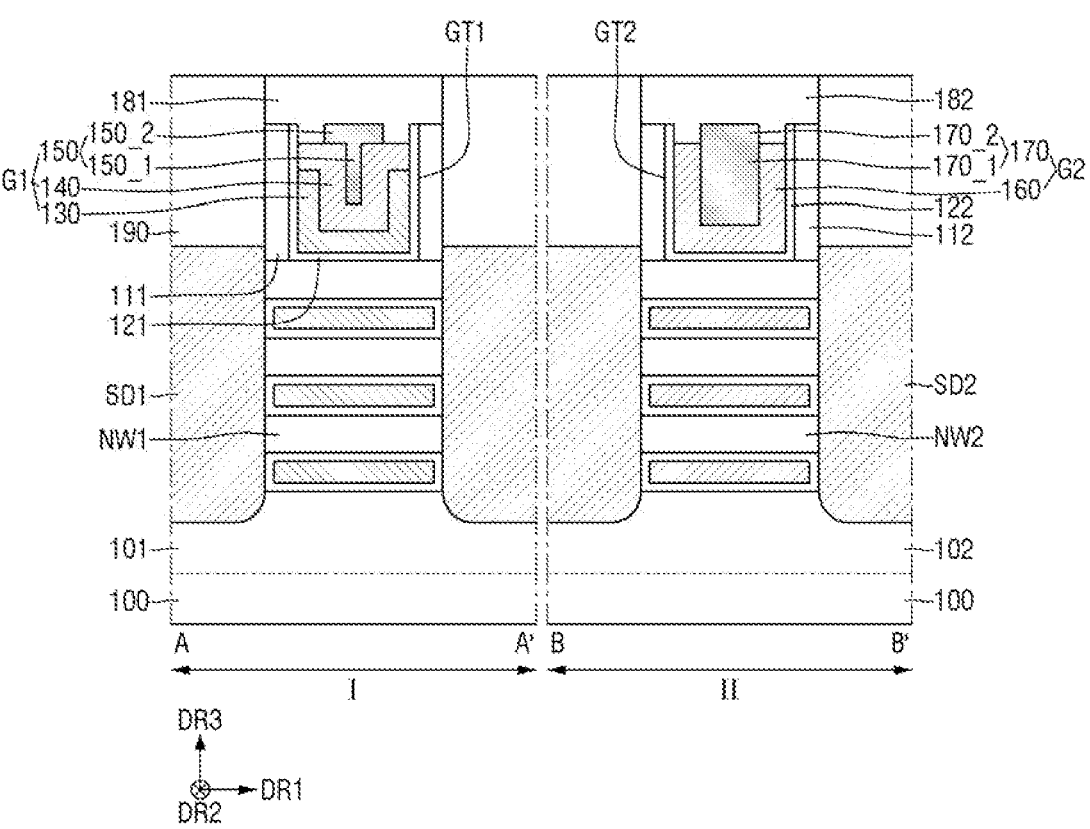
Figure 25:
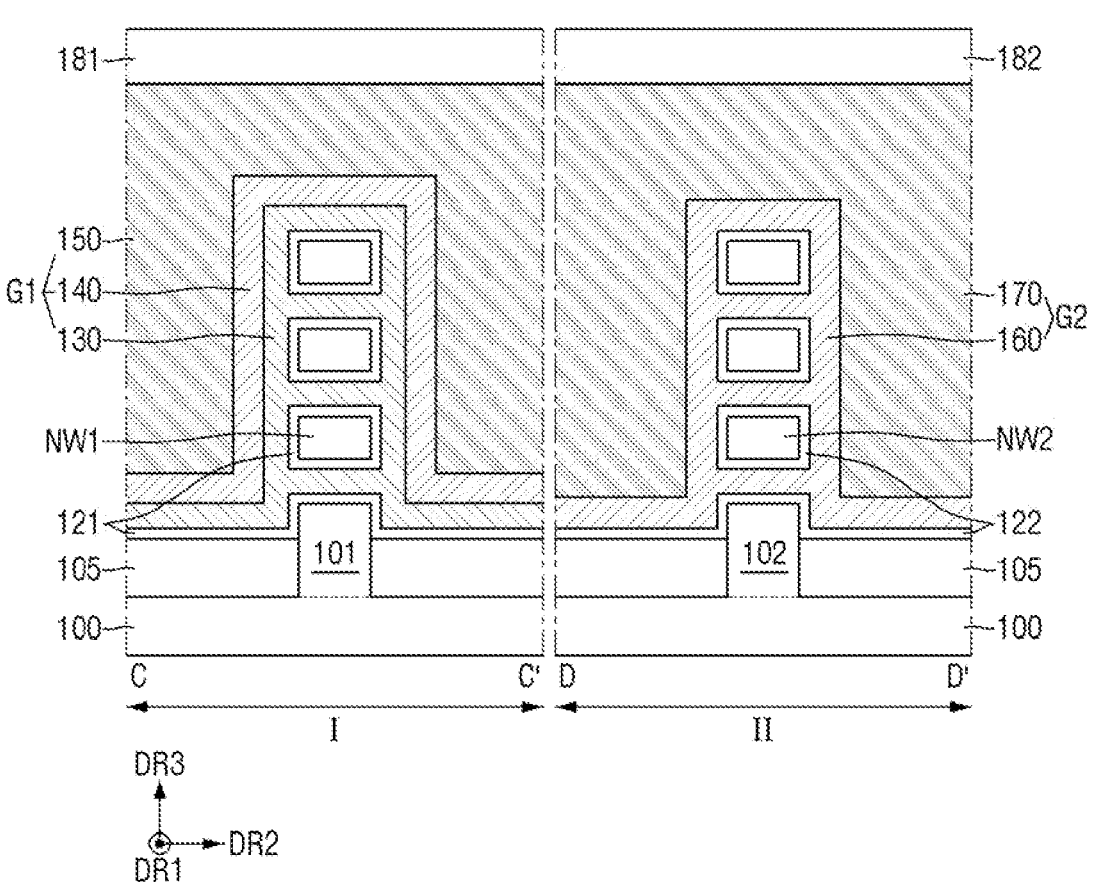

Referring to FIGS. 24 and 25, a first capping pattern 181 may be formed on the first gate electrode G1. The first capping pattern 181 may completely fill the inside of the first capping pattern trench (CT1 in FIG. 23) on the first gate electrode G1. In an implementation, the first capping pattern 181 may also be formed between the first gate insulating layer 121 and the second portion 150_2 of the third conductive layer 150 in the first gate trench GT1.

In an implementation, a second capping pattern 182 may be formed on the second gate electrode G2. The second capping pattern 182 may completely fill the inside of the second capping pattern trench (CT2 in FIG. 23) on the second gate electrode G2. In an implementation, the second capping pattern 182 may also be formed between the second gate insulating layer 122 and the second portion 170_2 of the fifth conductive layer 170 in the second gate trench GT2.

Referring back to FIGS. 2 and 3, a first gate contact CB1 penetrating through the first capping pattern 181 in the vertical direction DR3 to be connected to the first gate electrode G1 may be formed, and a second gate contact CB2 penetrating through the second capping pattern 182 in the vertical direction DR3 to be connected to the second gate electrode G2 may be formed.

Subsequently, an etching stop layer 192 and a second interlayer insulating layer 195 may be sequentially formed on each of the first interlayer insulating layer 190, the first and second capping patterns 181 and 182, and the first and second gate contacts CB1 and CB2. Subsequently, each of a first via V1 and a second via V2 penetrating through the second interlayer insulating layer 195 and the etching stop layer 192 in the vertical direction DR3 to be connected to each of the first gate contact CB1 and the second gate contact CB2 may be formed. Through such a manufacturing process, the semiconductor device illustrated in FIGS. 2 and 3 may be manufactured.

Hereinafter, a semiconductor device according to exemplary embodiments of the present disclosure will be described with reference to FIG. 26. Differences from the semiconductor device illustrated in FIGS. 1 to 3 will be mainly described.

Figure 26:
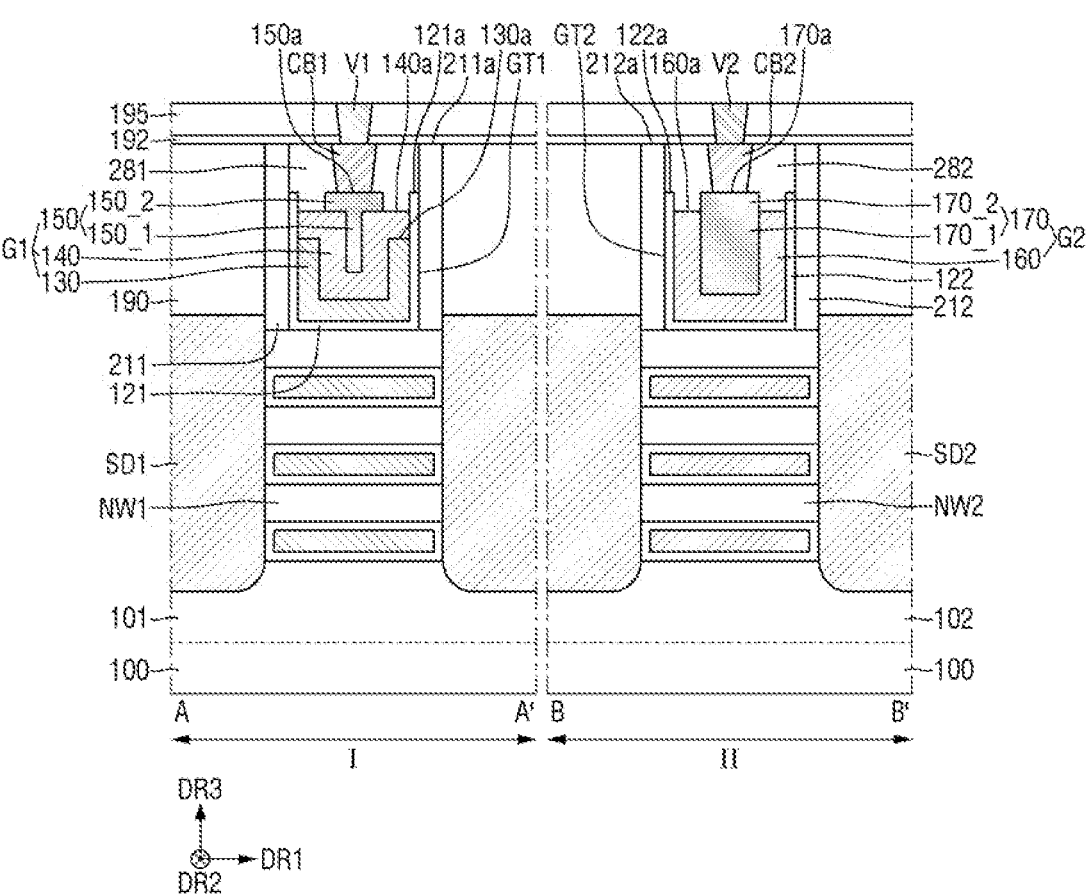
FIG. 26 is a cross-sectional view of a semiconductor device according to other exemplary embodiments of the present disclosure.

FIG. 26 is a cross-sectional view of a semiconductor device according to exemplary embodiments of the present disclosure.

Referring to FIG. 26, in a semiconductor device according to the exemplary embodiments of the present disclosure, a first capping pattern 281 may be between first gate spacers 211, and a second capping pattern 282 may be between second gate spacers 212.

At least a portion of the first capping pattern 281 may be in contact with a sidewall of the first gate spacer 211. In addition, at least a portion of the second capping pattern 282 may be in contact with a sidewall of the second gate spacer 212. An upper surface 211a of the first gate spacer 211 may be on the same plane as each of an upper surface of the first capping pattern 281 and the upper surface of the first interlayer insulating layer 190. In an implementation, an upper surface 212a of the second gate spacer 212 may be on the same plane as each of an upper surface of the second capping pattern 282 and the upper surface of the first interlayer insulating layer 190.

Hereinafter, a semiconductor device according to exemplary embodiments of the present disclosure will be described with reference to FIG. 27. Differences from the semiconductor device illustrated in FIGS. 1 to 3 will be mainly described.

Figure 27:
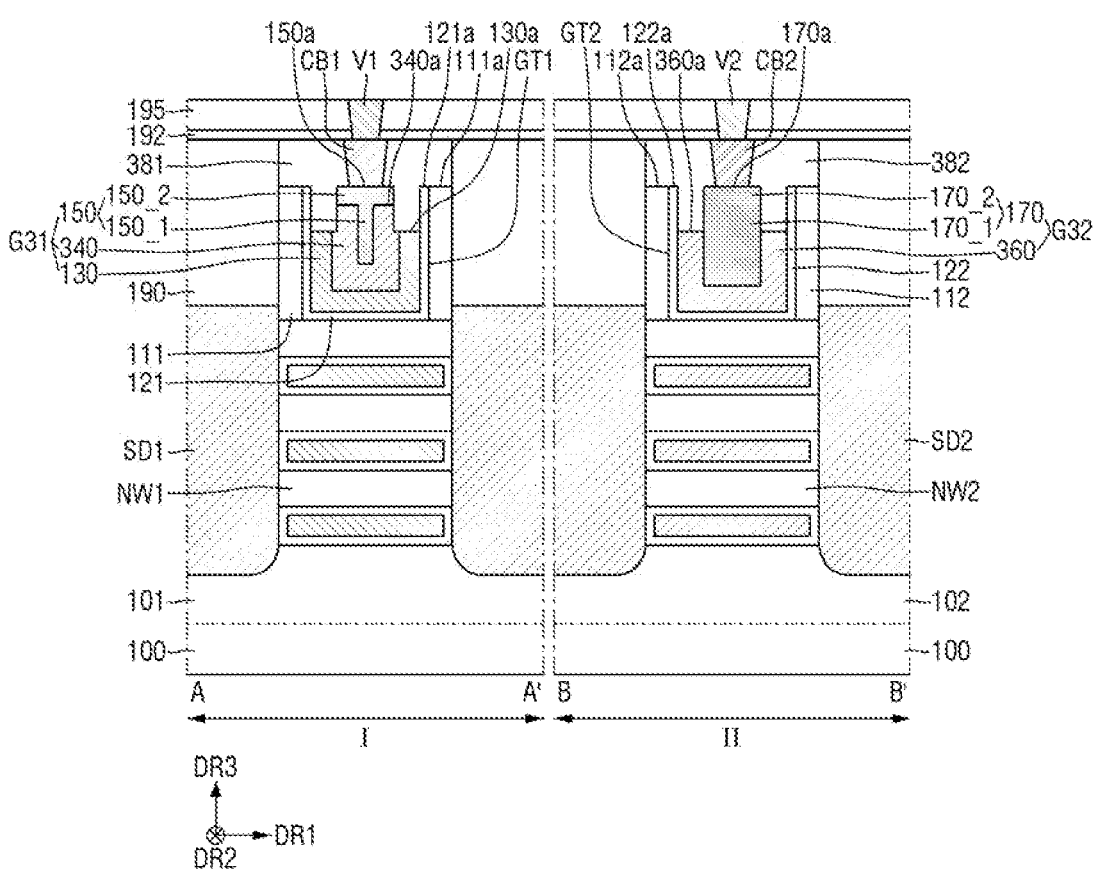
FIG. 27 is a cross-sectional view of a semiconductor device according to exemplary embodiments of the present disclosure.

FIG. 27 is a cross-sectional view of a semiconductor device according to exemplary embodiments of the present disclosure.

Referring to FIG. 27, in a semiconductor device according to the exemplary embodiments of the present disclosure, a first capping pattern 381 may be in contact with the uppermost surface 130a of the first conductive layer 130.

A first gate electrode G31 may include the first conductive layer 130, a second conductive layer 340, and the third conductive layer 150. A portion of the first capping pattern 381 between the first gate insulating layer 121 and the second portion 150_2 of the third conductive layer 150 may be in contact with the uppermost surface 130a of the first conductive layer 130. In an implementation, a lower side of the first capping pattern 381 may be between the first gate insulating layer 121 and an upper side of the second conductive layer 340. In an implementation, the lower side of the first capping pattern 381 may be in contact with a side surface of the upper side of the second conductive layer 340.

The uppermost surface 340a of the second conductive layer 340 may be in contact with the second portion 150_2 of the third conductive layer 150. In an implementation, a thickness of a portion of the second conductive layer 340 between the first portion 150_1 of the third conductive layer 150 and the first capping pattern 381 may be smaller than a thickness of a portion the second conductive layer 340 between the first portion 150_1 of the third conductive layer 150 and the first conductive layer 130.

A second gate electrode G32 may include a fourth conductive layer 360 and the fifth conductive layer 170. A portion of the second capping pattern 382 between the second gate insulating layer 122 and the second portion 170_2 of the fifth conductive layer 170 may be in contact with the uppermost surface 360a of the fourth conductive layer 360. In an implementation, the uppermost surface 360a of the fourth conductive layer 360 may be on the same plane as the uppermost surface 130a of the first conductive layer 130.

Hereinafter, a semiconductor device according to exemplary embodiments of the present disclosure will be described with reference to FIG. 28. Differences from the semiconductor device illustrated in FIGS. 1 to 3 will be mainly described.

Figure 28:
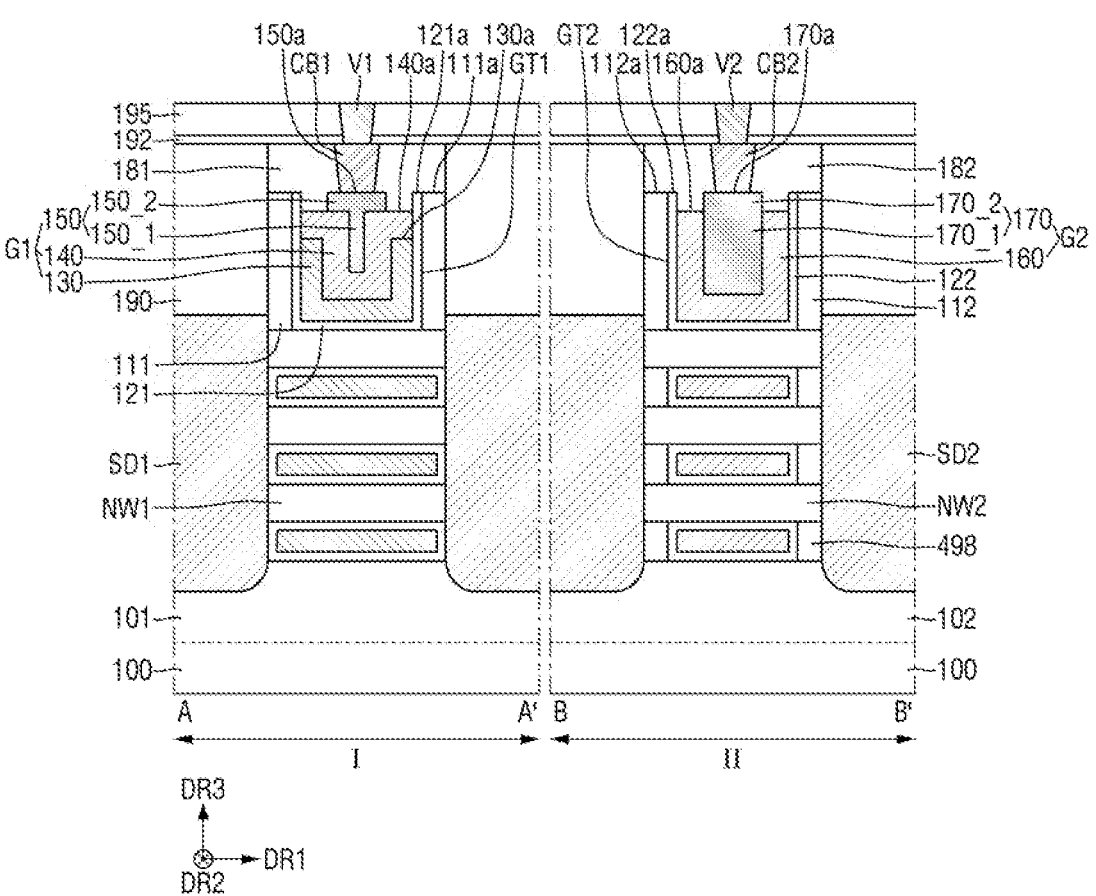
FIG. 28 is a cross-sectional view of a semiconductor device according to exemplary embodiments of the present disclosure.

FIG. 28 is a cross-sectional view of a semiconductor device according to exemplary embodiments of the present disclosure.

Referring to FIG. 28, in a semiconductor device according to the exemplary embodiments of the present disclosure, an inner spacer 498 may be between the second gate electrode G2 and the second source/drain region SD2.

In an implementation, the inner spacer 498 may be on both sidewalls of the fourth conductive layer 160 in the first horizontal direction DR1 between the second plurality of nanosheets NW2. In addition, the inner spacer 498 may be on both sidewalls of the fourth conductive layer 160 in the first horizontal direction DR1 between the second active pattern 102 and the second plurality of nanosheets NW2. The inner spacer 498 may be in contact with the second source/drain region SD2.

Hereinafter, a semiconductor device according to exemplary embodiments of the present disclosure will be described with reference to FIGS. 29 and 30. Differences from the semiconductor device illustrated in FIGS. 1 to 3 will be mainly described.

Figure 29:
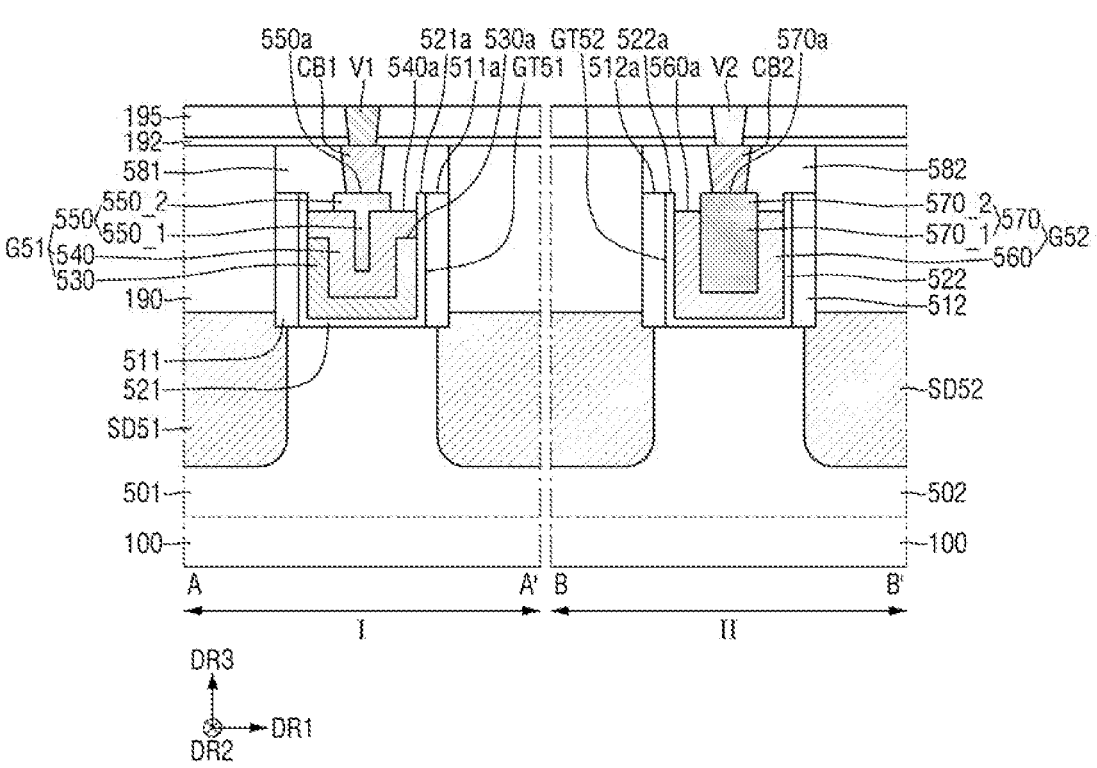
FIGS. 29 and 30 are cross-sectional views of a semiconductor device according to exemplary embodiments.
Figure 30:
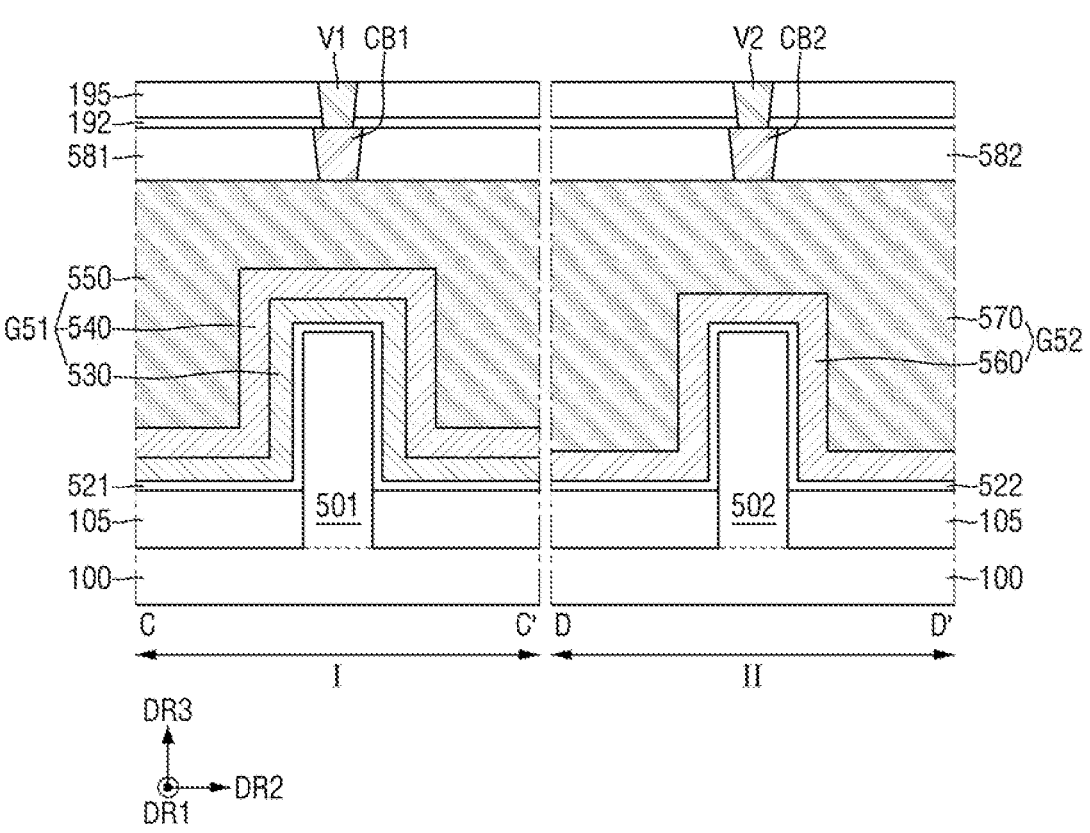

FIGS. 29 and 30 are cross-sectional views of a semiconductor device according to exemplary embodiments.

Referring to FIGS. 29 and 30, a semiconductor device according to the exemplary embodiments of the present disclosure may include a fin-type transistor (FinFET). In an implementation, the semiconductor device according to the exemplary embodiments of the present disclosure may include the substrate 100, first and second active patterns 501 and 502, the field insulating layer 105, first and second gate electrodes G51 and G52, first and second gate spacers 511 and 512, first and second gate insulating layers 521 and 522, first and second capping patterns 581 and 582, first and second source/drain regions SD51 and SD52, the first interlayer insulating layer 190, the first and second gate contacts CB1 and CB2, the etching stop layer 192, the second interlayer insulating layer 195, and the first and second vias V1 and V2. Hereinafter, descriptions of the components described with reference to FIGS. 1 to 3 may be omitted.

The first active pattern 501 may extend in the first horizontal direction DR1 on the first region I of the substrate 100. The second active pattern 502 may extend in the first horizontal direction DR1 on the second region II of the substrate 100. Each of the first and second active patterns 501 and 502 may protrude from the substrate 100 in the vertical direction DR3.

The first gate spacer 511 may be on the first region I of the substrate 100. The first gate spacer 511 may extend in the second horizontal direction DR2 on the first active pattern 501 and the field insulating layer 105. A first gate trench GT51 may be defined between the first gate spacers 511.

The second gate spacer 512 may be on the second region II of the substrate 100. The second gate spacer 512 may extend in the second horizontal direction DR2 on the second active pattern 502 and the field insulating layer 105. A second gate trench GT52 may be defined between the second gate spacers 512.

The first gate electrode G51 may be on the first region I of the substrate 100. The first gate electrode G51 may extend in the second horizontal direction DR2 on the first active pattern 501 and the field insulating layer 105. The first gate electrode G51 may be inside the first gate trench GT51. The second gate electrode G52 may be on the second region II of the substrate 100. The second gate electrode G52 may extend in the second horizontal direction DR2 on the second active pattern 502 and the field insulating layer 105. The second gate electrode G52 may be inside the second gate trench GT52.

The first gate insulating layer 521 may be along a sidewall and a bottom surface of the first gate trench GT51. The first gate insulating layer 521 may be between the first gate electrode G51 and the first gate spacer 511. The first gate insulating layer 521 may be between the first gate electrode G51 and the first active pattern 501. The first gate insulating layer 521 may be between the first gate electrode G51 and the field insulating layer 105.

The second gate insulating layer 522 may be along a sidewall and a bottom surface of the second gate trench GT52. The second gate insulating layer 522 may be between the second gate electrode G52 and the second gate spacer 512. The second gate insulating layer 522 may be between the second gate electrode G52 and the second active pattern 502. The second gate insulating layer 522 may be between the second gate electrode G52 and the field insulating layer 105.

The first gate electrode G51 may include a first conductive layer 530, a second conductive layer 540, and a third conductive layer 550. The first conductive layer 530 may be on the first gate insulating layer 521 in the first gate trench GT51. The first conductive layer 530 may be along the sidewall and the bottom surface of the first gate trench GT51. In an implementation, the uppermost surface 530a of the first conductive layer 530 may be lower than the uppermost surface 521a of the first gate insulating layer 521 and lower than the uppermost surface 511*a* of the first gate spacer 511. In an implementation, the first conductive layer 530 may include titanium aluminum nitride (TiAlN). In an implementation, the first conductive layer 530 may also include titanium nitride (TiN).

The second conductive layer 540 may be on the first conductive layer 530 in the first gate trench GT51. At least a portion of the second conductive layer 540 may be on the uppermost surface 530*a* of the first conductive layer 530. The second conductive layer 540 on the uppermost surface 530*a* of the first conductive layer 530 may be in contact with the first gate insulating layer 521. In an implementation, the uppermost surface 540*a* of the second conductive layer 540 may be lower than the uppermost surface 521*a* of the first gate insulating layer 521 and lower than the uppermost surface 511*a* of the first gate spacer 511. In an implementation, the uppermost surface 540*a* of the second conductive layer 540 may be higher than the uppermost surface 530*a* of the first conductive layer 530. In an implementation, the second conductive layer 540 may include titanium aluminum carbide (TiAlC). In an implementation, an amount of aluminum included in the second conductive layer 540 may be 20 at % to 40 at %.

The third conductive layer 550 may be on the second conductive layer 540 in the first gate trench GT51. The third conductive layer 550 may include a first portion 550_1 between portions of the second conductive layer 540, and a second portion 550_2 on the first portion 550_1. A width W2 of the second portion 550_2 of the third conductive layer 550 in the first horizontal direction DR1 may be greater than a width W1 of the first portion 550_1 of the third conductive layer 550 in the first horizontal direction DR1. The second portion 550_2 of the third conductive layer 550 may be spaced apart from the first gate insulating layer 521 in the first horizontal direction DR1 in the first gate trench GT51. The upper surface 550*a* of the second portion 550_2 of the third conductive layer 550 may be higher than the uppermost surface 540*a* of the second conductive layer 540. In an implementation, the third conductive layer 550 may include titanium nitride (TiN).

The first capping pattern 581 may extend in the second horizontal direction DR2 on the first gate electrode G51. In an implementation, the first capping pattern 581 may be in contact with each of the uppermost surface 521*a* of the first gate insulating layer 521 and the uppermost surface 511*a* of the first gate spacer 511. The first capping pattern 581 may be on the second conductive layer 540 and the third conductive layer 550. A portion of the first capping pattern 581 may be between the first gate insulating layer 521 and the second portion 550_2 of the third conductive layer 550 in the first gate trench GT51. The first capping pattern 581 may be in contact with each of a sidewall and an upper surface of the second portion 550_2 of the third conductive layer 550. The first capping pattern 581 may be in contact with the uppermost surface 540*a* of the second conductive layer 540 exposed between the first gate insulating layer 521 and the second portion 550_2 of the third conductive layer 550. The first capping pattern 581 may be in contact with a sidewall of the first gate insulating layer 521 facing the sidewall of the second portion 550_2 of the third conductive layer 550.

A second gate electrode G52 may include a fourth conductive layer 560 and a fifth conductive layer 570. The fourth conductive layer 560 may be on the second gate insulating layer 522 in the second gate trench GT52. The fourth conductive layer 560 may be along the sidewall and the bottom surface of the second gate trench GT52. In an implementation, the uppermost surface 560*a* of the fourth conductive layer 560 may be lower than the uppermost surface 522*a* of the second gate insulating layer 522 and lower than the uppermost surface 512*a* of the second gate spacer 512. In an implementation, the fourth conductive layer 560 may include titanium aluminum carbide (TiAlC). In an implementation, an amount of aluminum (Al) included in the fourth conductive layer 560 may be 20 at % to 40 at %.

The fifth conductive layer 570 may be on the fourth conductive layer 560 in the second gate trench GT52. The fifth conductive layer 570 may include a first portion 570_1 between portions of the fourth conductive layer 560 and a second portion 570_2 on the first portion 570_1. A width W4 of the second portion 570_2 of the fifth conductive layer 570 in the first horizontal direction DR1 may be the same as a width W3 of the first portion 570_1 of the fifth conductive layer 570 in the first horizontal direction DR1. In an implementation, the width W3 of the first portion 570_1 of the fifth conductive layer 570 in the first horizontal direction DR1 may be greater than the width W1 of the first portion 550_1 of the third conductive layer 550 in the first horizontal direction DR1. The second portion 570_2 of the fifth conductive layer 570 may be spaced apart from the second gate insulating layer 522 in the first horizontal direction DR1 in the second gate trench GT52.

The upper surface 570*a* of the second portion 570_2 of the fifth conductive layer 570 may be higher than the uppermost surface 560*a* of the fourth conductive layer 560. In an implementation, the upper surface 570*a* of the second portion 570_2 of the fifth conductive layer 570 may be on the same plane as the upper surface 550*a* of the second portion 550_2 of the third conductive layer 550. In an implementation, the fifth conductive layer 570 may include titanium nitride (TiN).

The second capping pattern 582 may extend in the second horizontal direction DR2 on the second gate electrode G52. In an implementation, the second capping pattern 582 may be in contact with each of the uppermost surface 522*a* of the second gate insulating layer 522 and the uppermost surface 512*a* of the second gate spacer 512. The second capping pattern 582 may be on the fourth conductive layer 560 and the fifth conductive layer 570. The second capping pattern 582 may include a portion between the second gate insulating layer 522 and the second portion 570_2 of the fifth conductive layer 170 in the second gate trench GT52. The second capping pattern 582 may be in contact with each of a sidewall and an upper surface of the second portion 570_2 of the fifth conductive layer 570. The second capping pattern 582 may be in contact with the uppermost surface 560*a* of the fourth conductive layer 560 exposed between the second gate insulating layer 522 and the second portion 570_2 of the fifth conductive layer 570. The second capping pattern 582 may be in contact with a sidewall of the second gate insulating layer 522 facing the sidewall of the second portion 570_2 of the fifth conductive layer 570.

The first source/drain region SD51 may be on both sides of the first gate electrode G51 on the first active pattern 501. The second source/drain region SD52 may be on both sides of the second gate electrode G52 on the second active pattern 502.

One or more embodiments may provide a semiconductor device including a multi-bridge channel field effect transistor (MBCFET™).

One or more embodiments may provide a semiconductor device capable of improving reliability of an electrical connection relationship between a conductive layer including titanium nitride (TiN) and a gate contact by etching a portion of a conductive layer including titanium aluminum carbide (TiAlC) in a gate electrode to lower a height of the conductive layer including titanium aluminum carbide (TiAlC).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate in which a first region and a second region are defined;
a first active pattern extending in a first horizontal direction on the first region of the substrate;
first gate spacers extending in a second horizontal direction different from the first horizontal direction on the first active pattern and defining a first gate trench;
a first gate insulating layer along a sidewall and a bottom surface of the first gate trench;
a first conductive layer on the first gate insulating layer in the first gate trench;
a second conductive layer on the first conductive layer in the first gate trench;
a third conductive layer on the second conductive layer in the first gate trench, the third conductive layer including:
a first portion between parts of the second conductive layer, and
a second portion on the first portion and in contact with an upper surface of the second conductive layer; and
a first capping pattern on the second conductive layer and the third conductive layer, the first capping pattern including a portion that is:
between the first gate insulating layer and the second portion of the third conductive layer, and
in contact with a sidewall of the second portion of the third conductive layer and in contact with a sidewall of the first gate insulating layer,
wherein a width of the second portion of the third conductive layer in the first horizontal direction is greater than a width of the first portion of the third conductive layer in the first horizontal direction.

2. The semiconductor device as claimed in claim 1, wherein an uppermost surface of the second conductive layer is higher than an uppermost surface of the first conductive layer.

3. The semiconductor device as claimed in claim 1, wherein upper surfaces of the first gate spacers are higher than an uppermost surface of the second conductive layer.

4. The semiconductor device as claimed in claim 1, further comprising a gate contact penetrating through the first capping pattern in a vertical direction and connected to the third conductive layer.

5. The semiconductor device as claimed in claim 1, wherein the first conductive layer includes a different material from that of the second conductive layer.

6. The semiconductor device as claimed in claim 5, wherein:
the first conductive layer includes titanium aluminum nitride (TiAlN), and
the second conductive layer includes titanium aluminum carbide (TiAlC).

7. The semiconductor device as claimed in claim 6, wherein an amount of aluminum included in the second conductive layer is 20% to 40%.

8. The semiconductor device as claimed in claim 1, further comprising:
a second active pattern extending in the first horizontal direction on the second region of the substrate;
second gate spacers extending in the second horizontal direction on the second active pattern and defining a second gate trench;
a second gate insulating layer along a sidewall and a bottom surface of the second gate trench;
a fourth conductive layer on the second gate insulating layer in the second gate trench, the fourth conductive layer including the same material as the second conductive layer;
a fifth conductive layer on the fourth conductive layer in the second gate trench, the fifth conductive layer including the same material as the third conductive layer, and including:
a first portion between parts of the fourth conductive layer, and
a second portion on the first portion; and
a second capping pattern on the fourth conductive layer and the fifth conductive layer, the second capping pattern including a portion that is:
between the second gate insulating layer and the second portion of the fifth conductive layer, and
in contact with a sidewall of the second portion of the fifth conductive layer.

9. The semiconductor device as claimed in claim 1, further comprising a first plurality of nanosheets stacked to be spaced apart from each other in a vertical direction on the first active pattern, the first plurality of nanosheets being surrounded by the first conductive layer.

10. The semiconductor device as claimed in claim 1, wherein the portion of the first capping pattern between the first gate insulating layer and the second portion of the third conductive layer is in contact with each of a sidewall of the first gate insulating layer and an uppermost surface of the second conductive layer.

11. The semiconductor device as claimed in claim 1, wherein an upper surface of the second portion of the third conductive layer is on the same plane as an uppermost surface of the first gate insulating layer and on the same plane as an uppermost surface of the first gate spacers.

12. The semiconductor device as claimed in claim 1, wherein an upper surface of the second portion of the third conductive layer is parallel to a lowermost surface of the second portion of the third conductive layer.

13. A semiconductor device, comprising:
a substrate in which a PMOS region and an NMOS region are defined;
a first active pattern extending in a first horizontal direction on the PMOS region of the substrate;
a second active pattern extending in the first horizontal direction on the NMOS region of the substrate;
first gate spacers extending in a second horizontal direction different from the first horizontal direction on the first active pattern and defining a first gate trench;

second gate spacers extending in the second horizontal direction on the second active pattern and defining a second gate trench;

a gate insulating layer along a sidewall and a bottom surface of the first gate trench;

a first conductive layer along a sidewall and a bottom surface of the first gate trench, on the gate insulating layer;

a second conductive layer on the first conductive layer in the first gate trench;

a third conductive layer on the second conductive layer in the first gate trench, the third conductive layer including:

a first portion between parts of the second conductive layer, and a second portion on the first portion and in contact with an upper surface of the second conductive layer;

a fourth conductive layer along a sidewall and a bottom surface of the second gate trench, the fourth conductive layer including the same material as the second conductive layer;

a fifth conductive layer on the fourth conductive layer in the second gate trench, the fifth conductive layer including the same material as the third conductive layer, and including:

a first portion between parts of the fourth conductive layer, and a second portion on the first portion;

a first capping pattern on the second conductive layer and the third conductive layer, the first capping pattern including a portion that is:

between the first gate spacers and the second portion of the third conductive layer, and in contact with a sidewall of the second portion of the third conductive layer and in contact with a sidewall of the gate insulating layer; and a second capping pattern on the fourth conductive layer and the fifth conductive layer, the second capping pattern including a portion that is:

between the second gate spacers and the second portion of the fifth conductive layer, and in contact with a sidewall of the second portion of the fifth conductive layer, wherein:

the first conductive layer includes a material different from that of the second conductive layer, and a width of the second portion of the third conductive layer in the first horizontal direction is greater than a width of the first portion of the third conductive layer in the first horizontal direction.

14. The semiconductor device as claimed in claim 13, wherein a width of the second portion of the fifth conductive layer in the first horizontal direction is the same as a width of the first portion of the fifth conductive layer in the first horizontal direction.

15. The semiconductor device as claimed in claim 13, wherein an uppermost surface of the fourth conductive layer is higher than an uppermost surface of the first conductive layer.

16. The semiconductor device as claimed in claim 13, wherein a width of the first portion of the fifth conductive layer in the first horizontal direction is greater than the width of the first portion of the third conductive layer in the first horizontal direction.

17. The semiconductor device as claimed in claim 13, further comprising:

a first plurality of nanosheets stacked to be spaced apart from each other in a vertical direction on the first active pattern, the first plurality of nanosheets being surrounded by the first conductive layer; and a second plurality of nanosheets stacked to be spaced apart from each other in the vertical direction on the second active pattern, the second plurality of nanosheets being surrounded by the fourth conductive layer.

18. The semiconductor device as claimed in claim 17, wherein:

the fourth conductive layer is not between the first plurality of nanosheets, and the first conductive layer is not between the second plurality of nanosheets.

19. A semiconductor device, comprising:

a substrate in which a PMOS region and an NMOS region are defined;

a first active pattern extending in a first horizontal direction on the PMOS region of the substrate;

a second active pattern extending in the first horizontal direction on the NMOS region of the substrate;

a first plurality of nanosheets stacked to be spaced apart from each other in a vertical direction on the first active pattern;

a second plurality of nanosheets stacked to be spaced apart from each other in the vertical direction on the second active pattern;

first gate spacers extending in a second horizontal direction different from the first horizontal direction on the first active pattern and defining a first gate trench;

second gate spacers extending in the second horizontal direction on the second active pattern and defining a second gate trench;

a first gate insulating layer along a sidewall and a bottom surface of the first gate trench;

a first conductive layer on the first gate insulating layer in the first gate trench, the first conductive layer including titanium aluminum nitride (TiAlN);

a second conductive layer on the first conductive layer in the first gate trench, the second conductive layer including titanium aluminum carbide (TiAlC);

a third conductive layer on the second conductive layer in the first gate trench, the third conductive layer including titanium nitride (TiN), and including:

a first portion between parts of the second conductive layer, and a second portion on the first portion and in contact with an upper surface of the second conductive layer;

a second gate insulating layer along a sidewall and a bottom surface of the second gate trench;

a fourth conductive layer on the second gate insulating layer in the second gate trench, the fourth conductive layer including titanium aluminum carbide (TiAlC);

a fifth conductive layer on the fourth conductive layer in the second gate trench, the fifth conductive layer including titanium nitride (TiN) and including:

a first portion between parts of the fourth conductive layer, and a second portion on the first portion; and a first capping pattern on the second conductive layer and the third conductive layer, the first capping pattern including a portion that is:

between the first gate spacers and the second portion of the third conductive layer, and in contact with a sidewall of the second portion of the third conductive layer and in contact with a sidewall of the first gate insulating layer, a second capping pattern on the fourth conductive layer and the fifth conductive layer, the second capping pattern including a portion that is:

between the second gate spacers and the second portion of the fifth conductive layer, and in contact with a sidewall of the second portion of the fifth conductive layer;

a first gate contact penetrating through the first capping pattern in the vertical direction and connected to the third conductive layer; and a second gate contact penetrating through the second capping pattern in the vertical direction and connected to the fifth conductive layer, wherein a width of the second portion of the third conductive layer in the first horizontal direction is greater than a width of the first portion of the third conductive layer in the first horizontal direction.

20. The semiconductor device as claimed in claim 19, wherein an uppermost surface of the second conductive layer is below an uppermost surface of the first gate insulating layer and below a lowermost surface of the second portion of the third conductive layer.

* * * * *